United States Patent
Sasaki et al.

(10) Patent No.: US 7,449,802 B2
(45) Date of Patent: *Nov. 11, 2008

(54) VIBRATION WAVE LINEAR MOTOR

(75) Inventors: Yasuo Sasaki, Tokyo (JP); Toshihiro Nakao, Tokyo (JP); Kazutoshi Shiratori, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/022,660

(22) Filed: Jan. 30, 2008

(65) Prior Publication Data

US 2008/0129126 A1 Jun. 5, 2008

Related U.S. Application Data

(63) Continuation of application No. 10/901,670, filed on Jul. 29, 2004, now Pat. No. 7,348,693.

(30) Foreign Application Priority Data

Aug. 6, 2003 (JP) ............................. 2003-206255

(51) Int. Cl.
*H02K 41/00* (2006.01)
(52) U.S. Cl. ........................................ 310/12
(58) Field of Classification Search ................. 310/12, 310/15, 323.01, 323.02, 323.17, 328
See application file for complete search history.

(56) References Cited

U.S. PATENT DOCUMENTS

| 5,644,440 | A | 7/1997 | Akada |
| 5,812,330 | A | 9/1998 | Akada |
| 7,084,550 | B2 | 8/2006 | Sasaki et al. |
| 7,348,693 | B2 * | 3/2008 | Sasaki et al. ............ 310/12 |
| 2005/0062346 | A1 | 3/2005 | Sasaki |

FOREIGN PATENT DOCUMENTS

| JP | HEI04-069072 | 3/1992 |
| JP | HEI7-163162 | 6/1995 |
| JP | HEI08-179184 | 7/1996 |
| JP | HEI09-149664 | 6/1997 |

* cited by examiner

*Primary Examiner*—Karl Tamai
*Assistant Examiner*—Nguyen Hanh
(74) *Attorney, Agent, or Firm*—Scully, Scott, Murphy & Presser, P.C.

(57) ABSTRACT

In a vibration wave linear motor, a coupled driving contacting parts are respectively provided on the top and the bottom of a vibrator unit, and 2 upper and lower guide shafts which contact concave parts of the coupled driving contacting parts are supported by erecting parts of a supporting part. The lower guide shaft is pressed upward by spiral springs, so that the two guide shafts press and sandwich the vibrator. Alternating current voltages having different phases are applied to the vibrator unit, whereby the vibrator unit generates a vibration wave to generate elliptical rotation vibrations in the driving contacting parts. As a result, the vibrator, and the two guide shafts and the supporting part make a relative move in the shaft direction. Either the guide shafts or the vibrator is fixed, and the other is linked to an object to be driven.

9 Claims, 23 Drawing Sheets

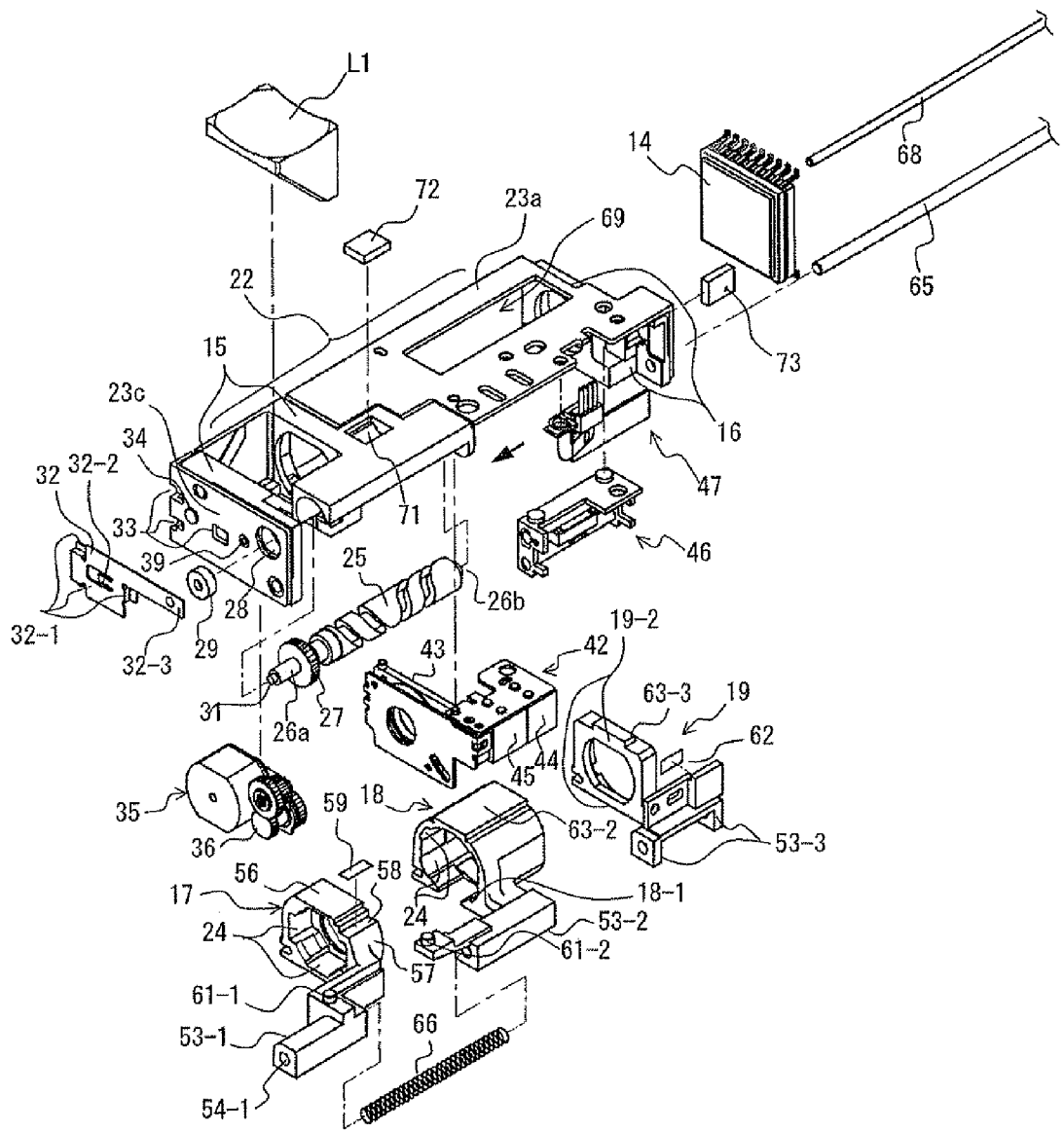
F I G. 2

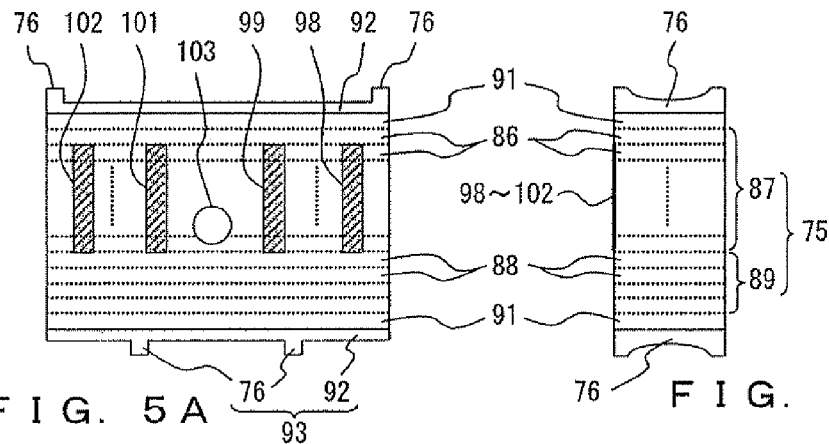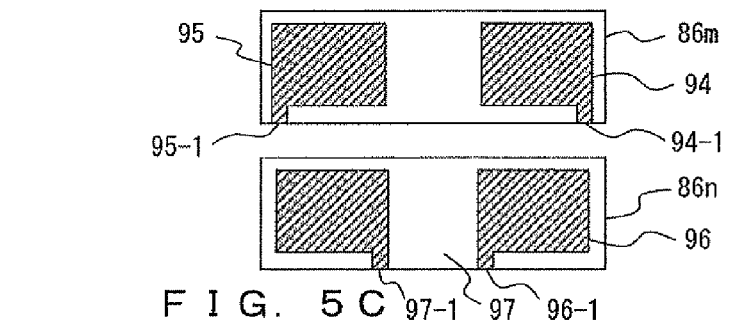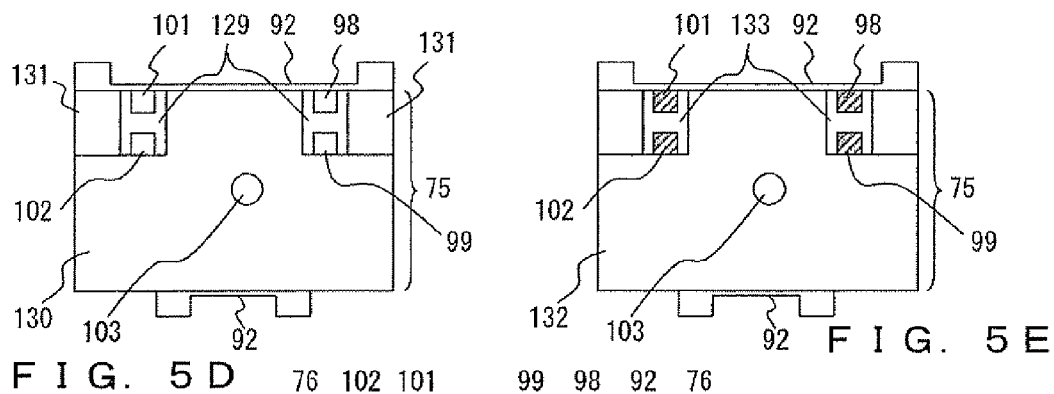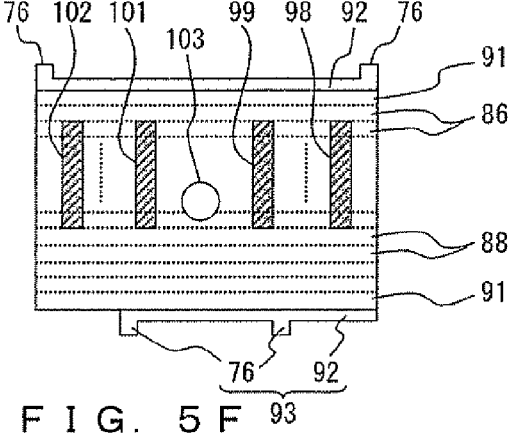

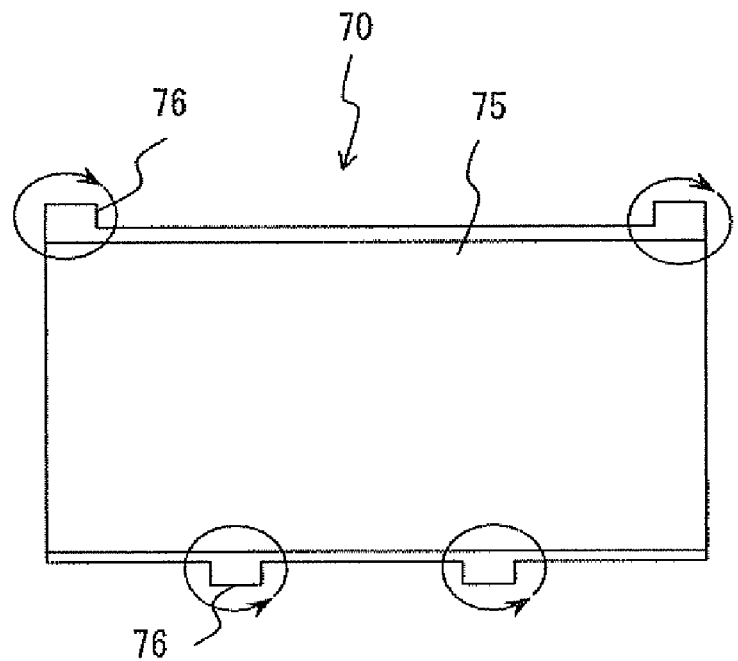
F I G. 8 A
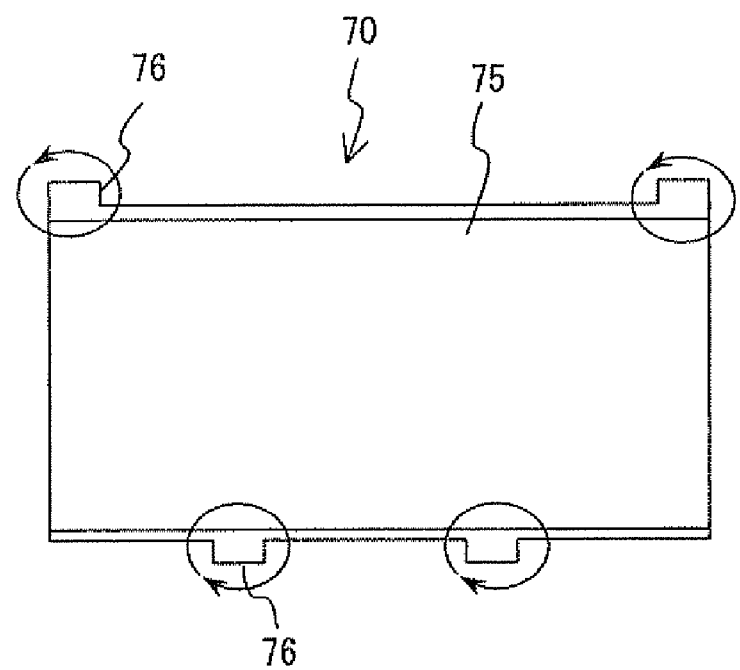
F I G. 8 B

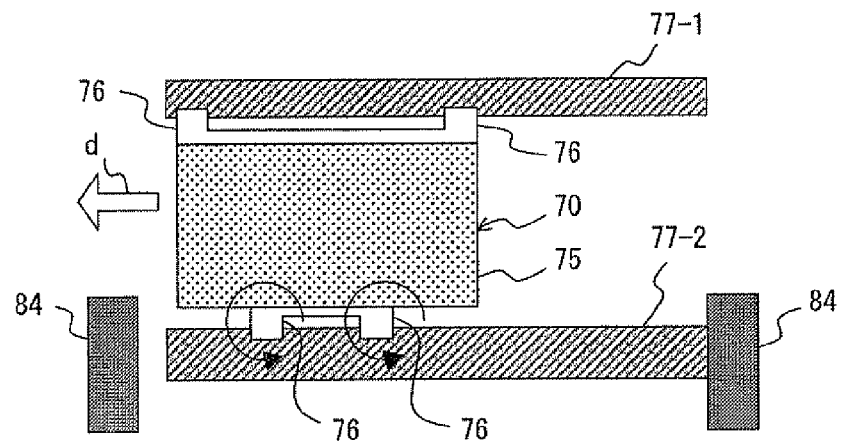
F I G. 9 A
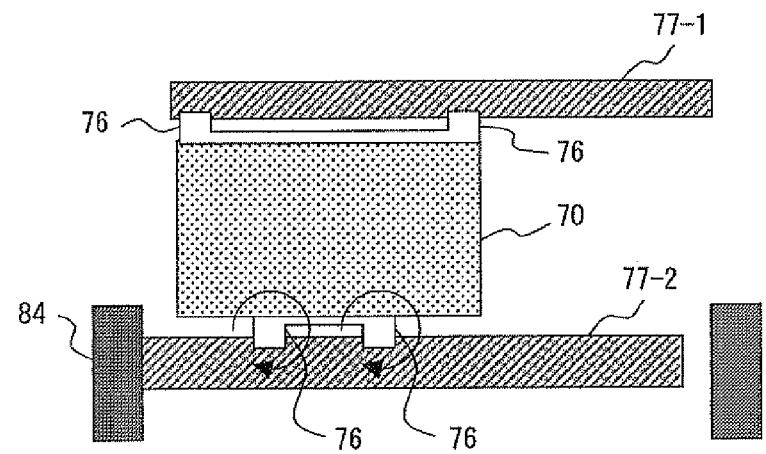
F I G. 9 B
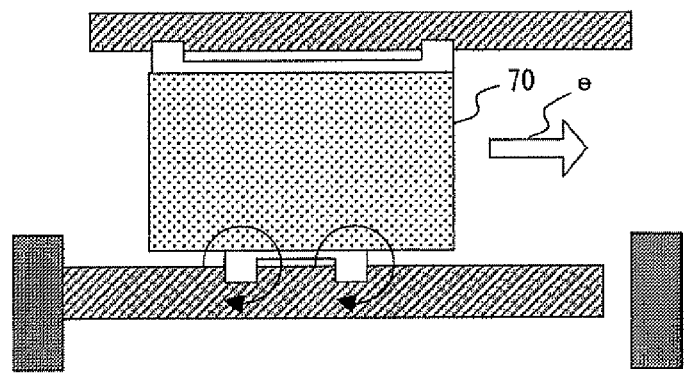
F I G. 9 C

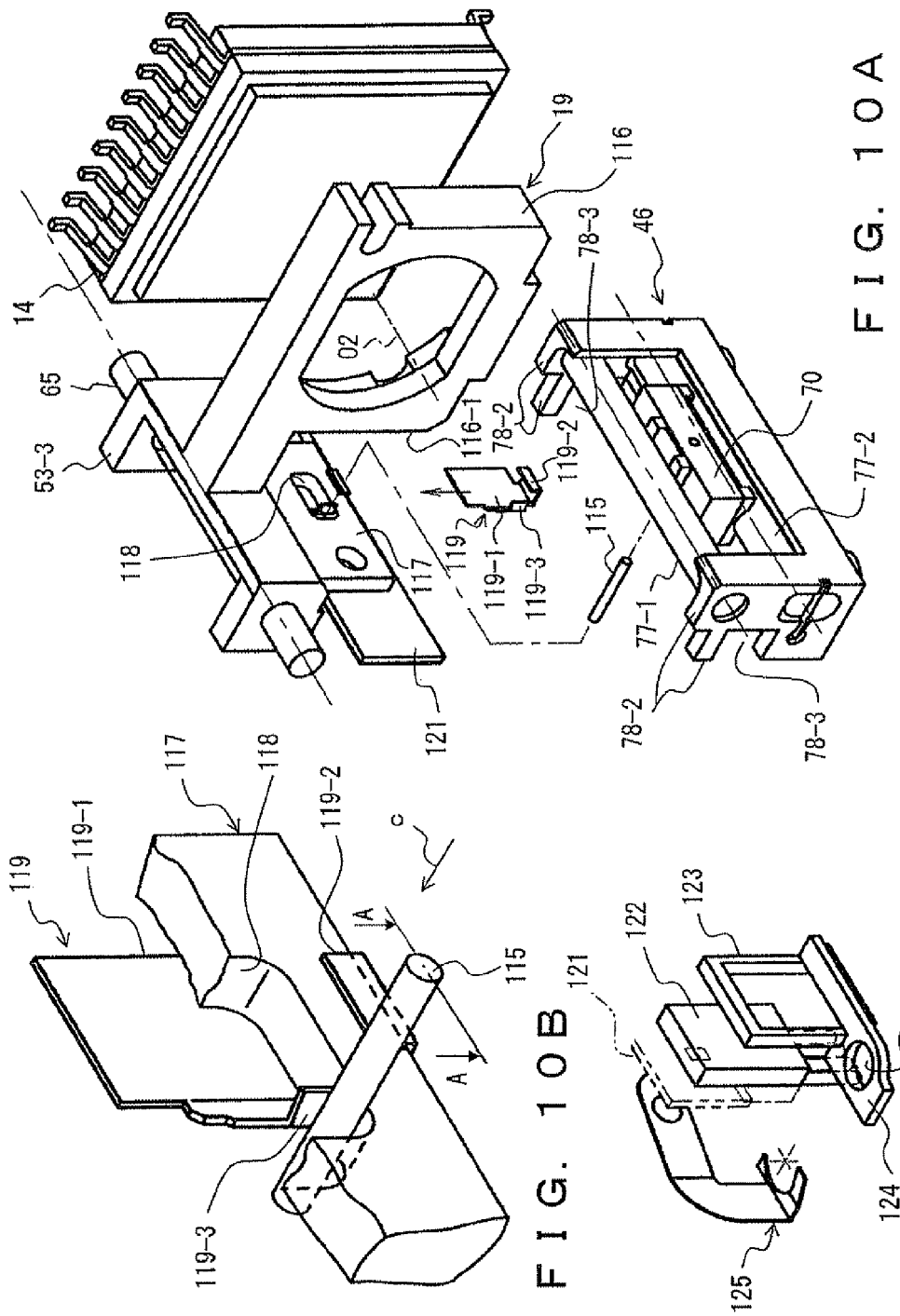

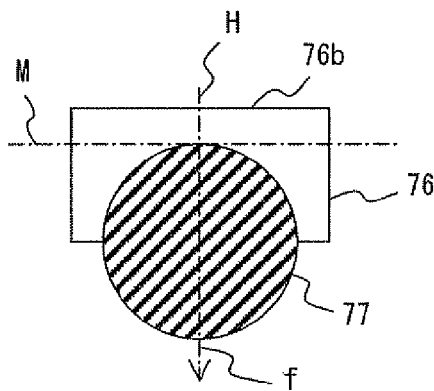
F I G. 1 5 A
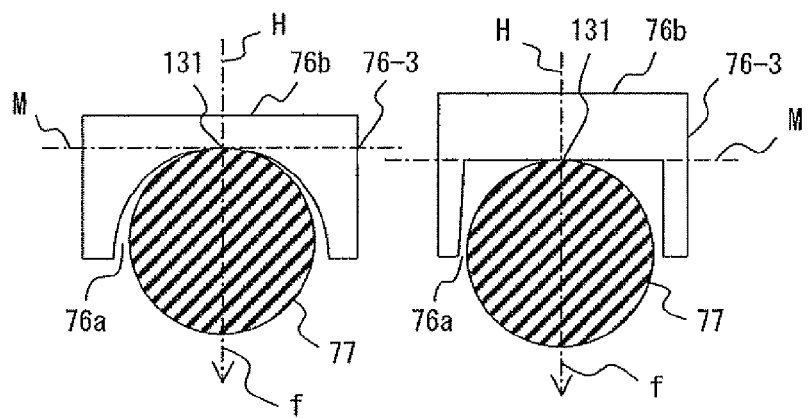
F I G. 1 5 B   F I G. 1 5 C
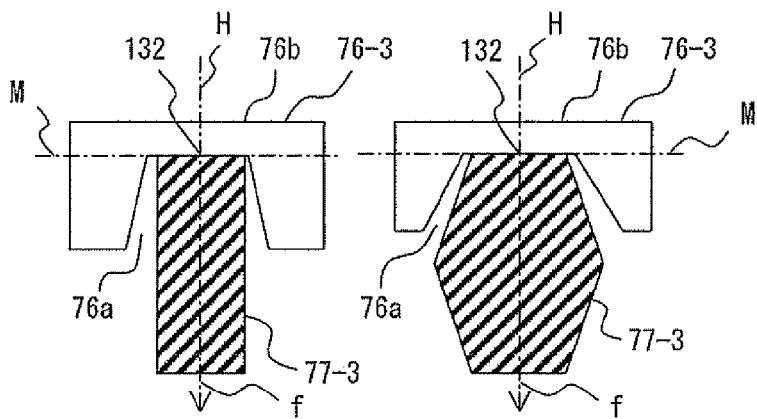
F I G. 1 5 D   F I G. 1 5 E

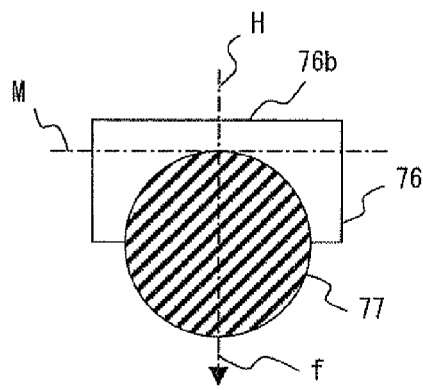
F I G. 16A
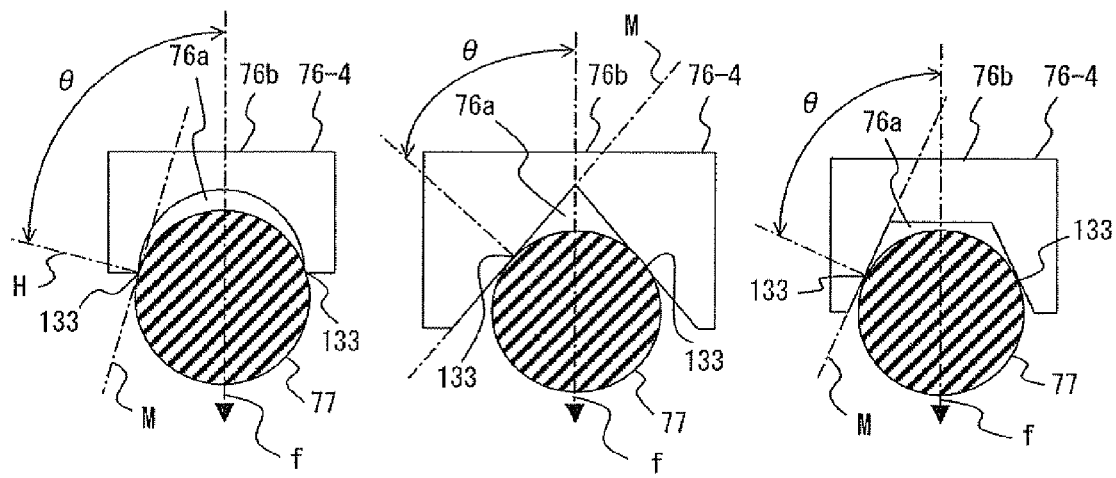
F I G. 16B  F I G. 16C  F I G. 16D
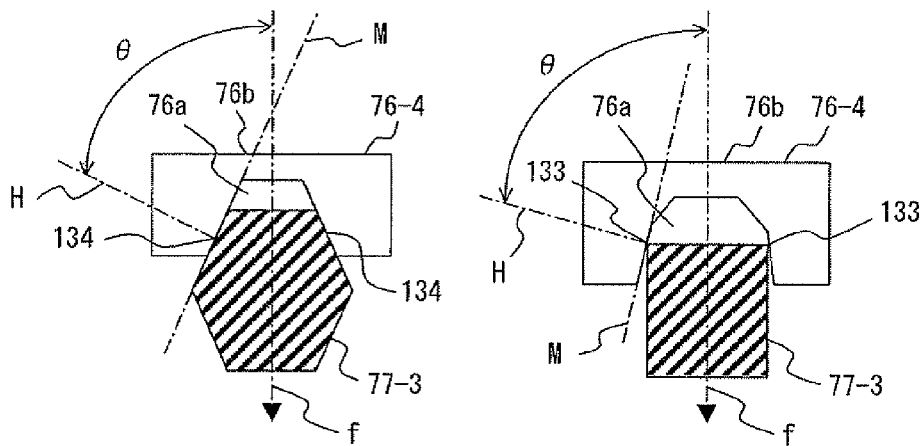
F I G. 16E  F I G. 16F

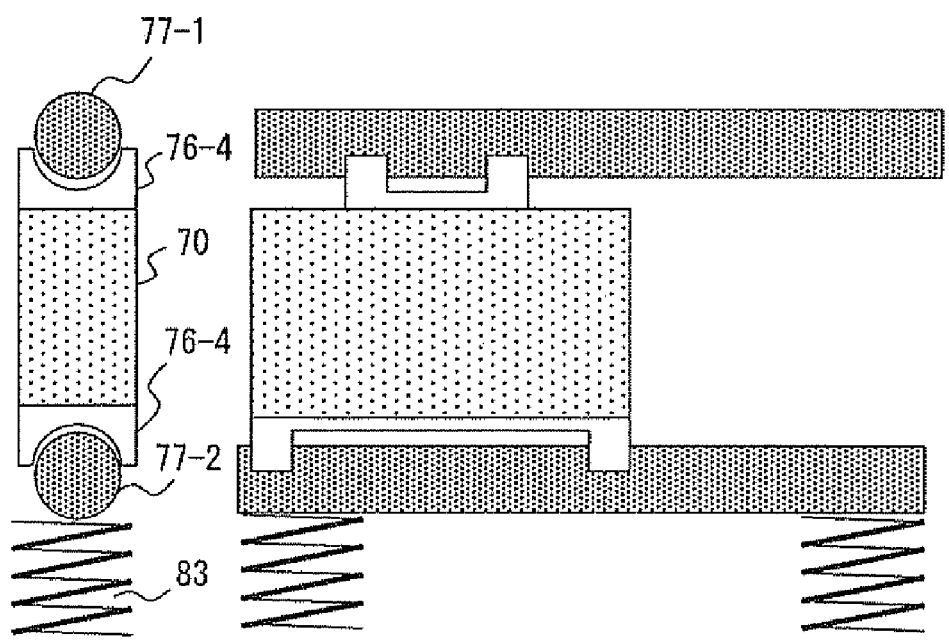
F I G. 18 A
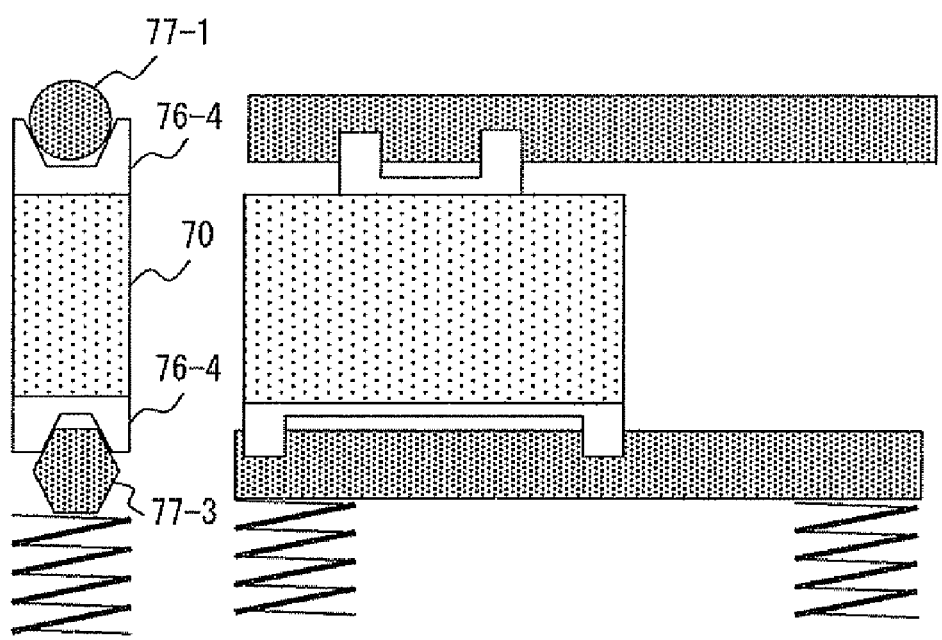
F I G. 18 B

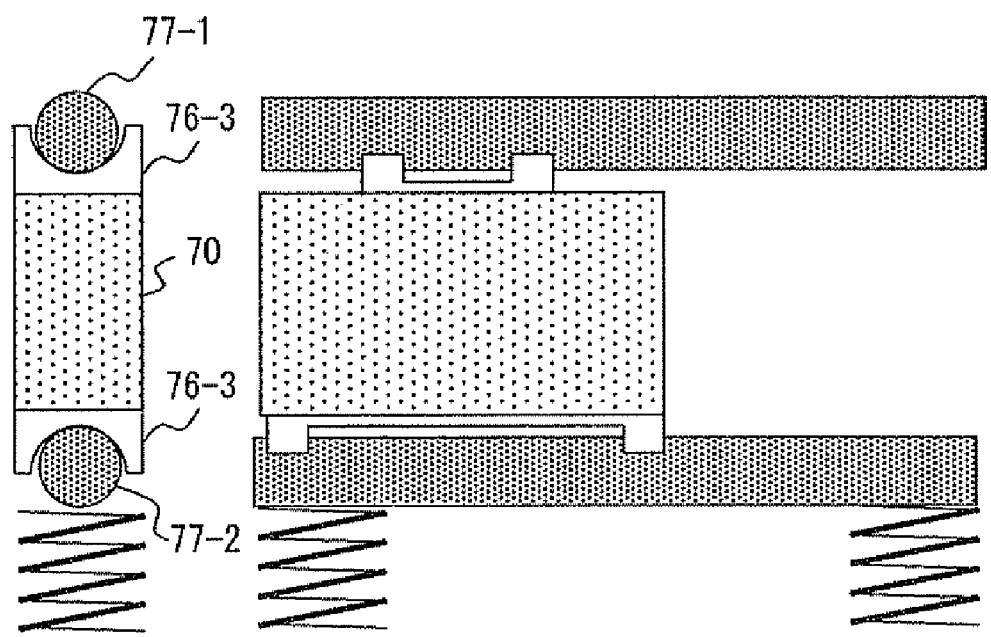
F I G. 2 0 A
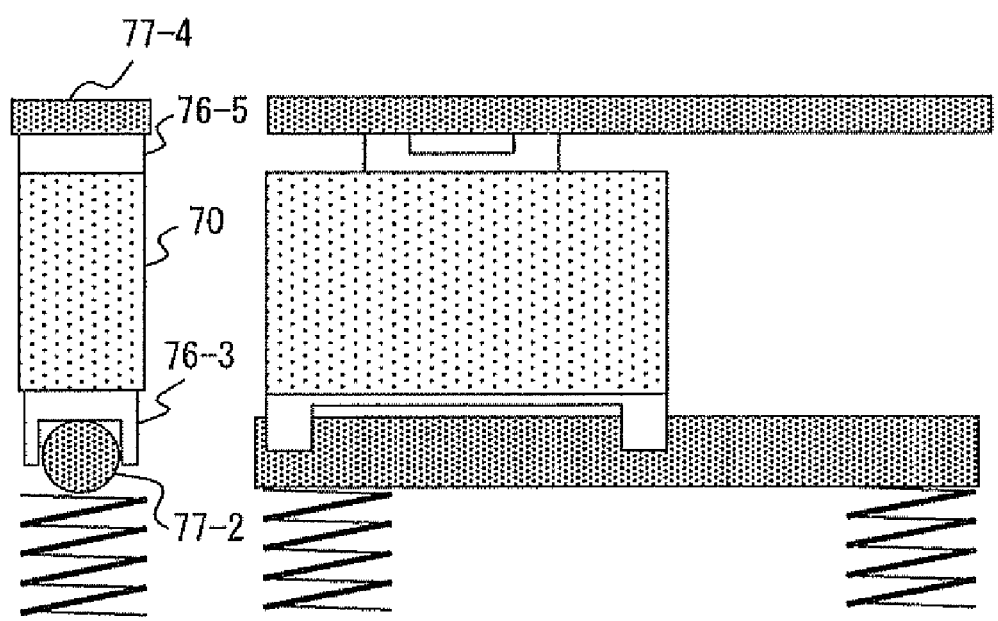
F I G. 2 0 B

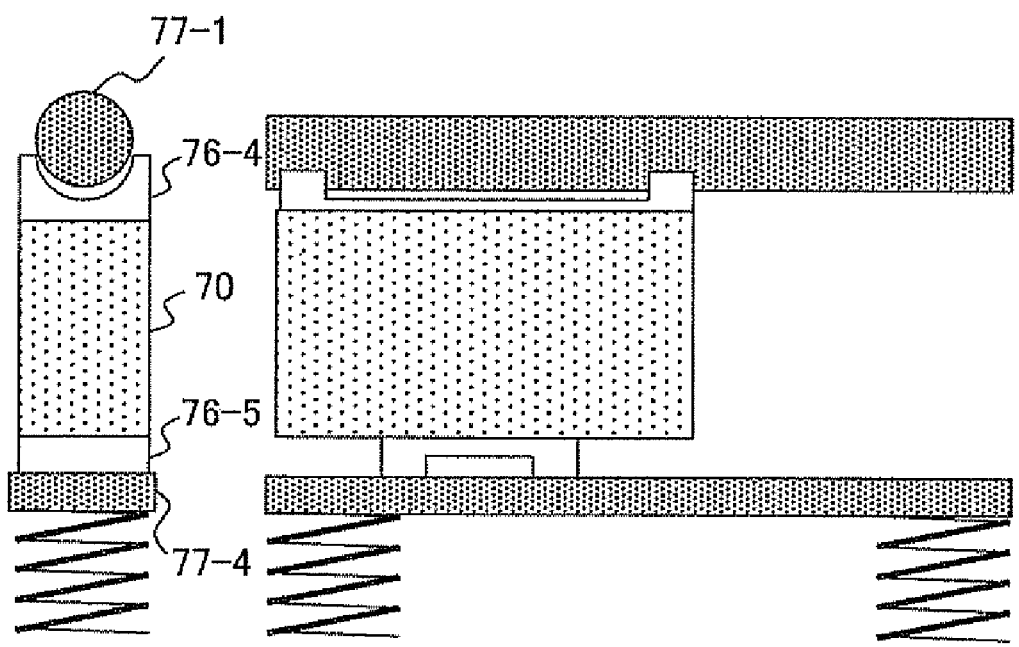
F I G. 2 2 A
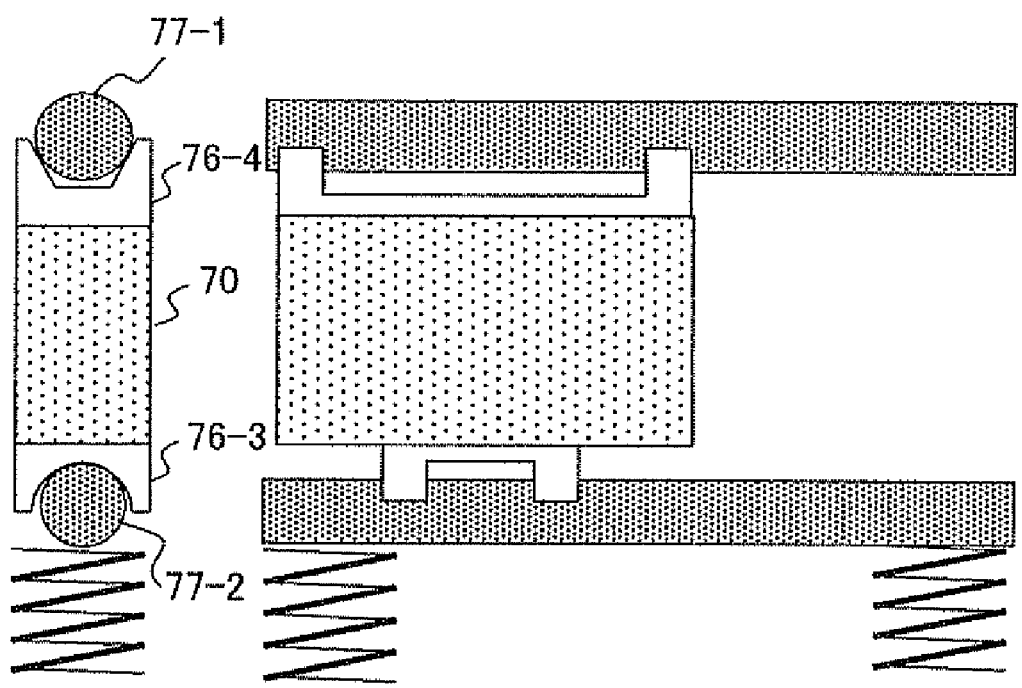
F I G. 2 2 B

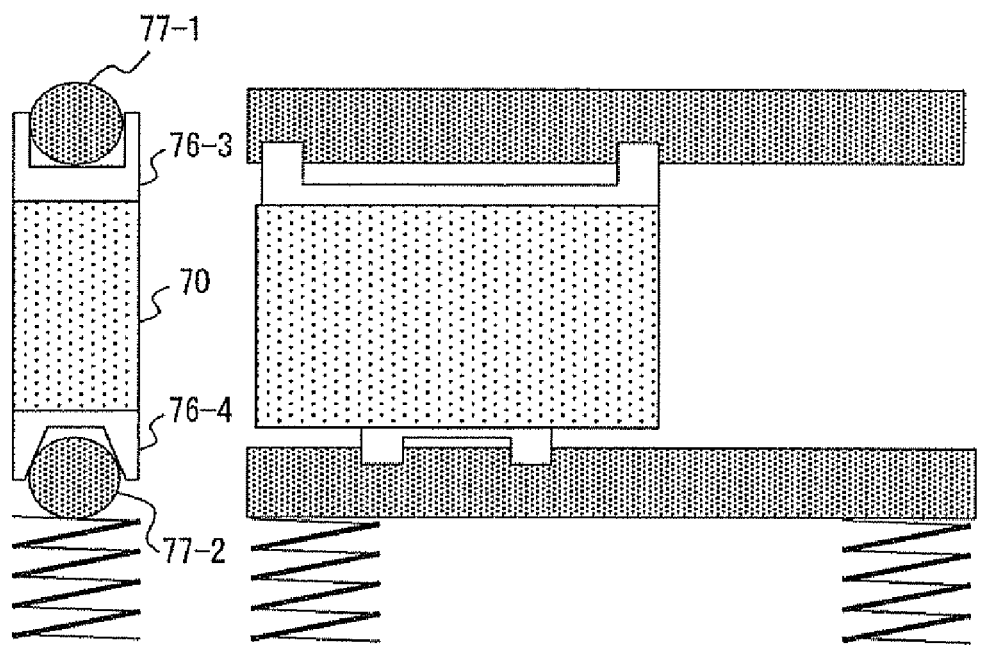
F I G. 2 3 A
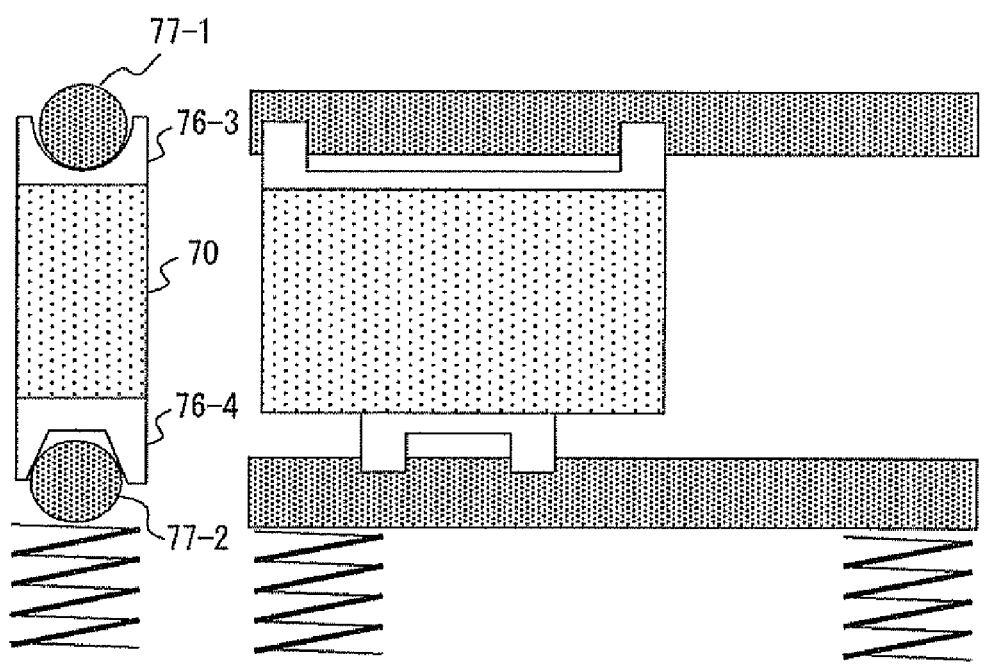
F I G. 2 3 B

VIBRATION WAVE LINEAR MOTOR

CROSS REFERENCE TO RELATED APPLICATION

This application is a Continuation of U.S. application Ser. No. 10/901,670 filed on Jul. 29, 2004 which is based upon and claims the benefit of priority from prior Japanese Application No. 2003-206255, filed Aug. 6, 2003, the entire contents of each of which are incorporated herein by reference.

BACKGROUND OF THE INVENTION

1. Field of the Invention

The present invention relates to a vibration wave linear motor using a vibrator, and more particularly, to a vibration wave linear motor that can be reduced in size with a simple configuration.

2. Description of the Related Art

In recent years, attention has been paid to an ultrasonic motor (vibration wave motor) as a new motor replacing an electromagnetic motor. This ultrasonic motor has advantages such that (a) high thrust at a low speed can be obtained without a gear, (b) holding force is high, (c) a stroke is long, and a resolution is high, (d) noise is very low, and (e) magnetic noise is not caused, and noise influence is not exerted, in comparison with a conventional electromagnetic motor.

As a conventional ultrasonic motor having such advantages, a linear-type ultrasonic motor as one basic form using an ultrasonic vibrator is proposed by the present applicant (for example, paragraphs [0035] to [0040], and FIGS. 7 and 18 of Japanese Patent Publication No. HEI07-163162).

Additionally, it is proposed by utilizing the above described characteristics that an ultrasonic motor is used as a driving source for moving a lens frame of a camera backward and forward by providing a vibrator integrally with the lens frame, which is a lens holding member, and by moving the lens frame backward and forward with reference to a fixed shaft with the vibrator (for example, see Abstract of the Disclosure, and FIG. 1 of Japanese Patent Publication No. HEI08-179184).

Also a card carrying apparatus using an ultrasonic motor is proposed. This ultrasonic motor comprises a ring-shaped vibration board that vibrates in multiple modes, and a pair of guide rails where grooves for guiding the vibration board are formed. As one of the guide rails, a movable rail is arranged, and presses the vibration board. As a result, the vibration board linearly moves along the guide rails by being vibrated (for example, see line 20 in the left column on page 3 to line 13 in the left column on page 4, and FIGS. 1 and 3 of Japanese Patent Publication No. HEI04-069072).

Furthermore, a linear ultrasonic motor that linearly moves a shaft by pressing a vibrator and the shaft to be driven with the use of a pressure roller, and by ultrasonic-vibrating the vibrator is proposed. Besides, it is recited that the cross section of the vibrator is made V-shaped or arc-shaped in the pressing portion of the vibrator and the shaft (for example, see "Abstract of the Disclosure", and FIG. 1 of Japanese Patent Publication No. HEI09-149664).

SUMMARY OF THE INVENTION

A vibration wave linear motor according to the present invention comprises: a base board; a first contacting member fixed to the base board; a second contacting member arranged to be movable toward the first contacting member; a pressing unit pressing the second contacting member toward the first contacting member; a vibrator, which is arranged between the first and the second contacting members, vibrating by being applied with a driving signal, and making a relative move in a predetermined relative move direction with reference to the first contacting member; first and second driving contacting parts arranged in predetermined intervals in the relative move direction in order to contact the first contacting member on a side of the vibrator, which faces the first contacting member; and a third driving contacting part arranged in a position corresponding to in between the first and the second driving contacting parts on a side of the vibrator, which faces the second contacting member.

BRIEF DESCRIPTION OF THE DRAWINGS

FIG. 1B is a schematic showing a simplified configuration of respective lens units when a cross section, taken along an arrow line A-A', of the lens apparatus shown in FIG. 1A is viewed in the direction of an arrow a;

FIG. 2 is a perspective view showing the disassembly of the lens apparatus when viewed from upward;

FIG. 5A is a front view of a vibrator of a vibration wave linear motor;

FIG. 5B is a side view of the vibrator shown in FIG. 5A;

FIG. 5C shows an arrangement of piezoelectric sheets and electrodes of the vibrator shown in FIGS. 5A and 5B;

FIGS. 5D to 5F exemplify another configuration of the vibrator;

FIGS. 8A and 8B are schematics showing the elliptical vibrations of the driving contacting parts of the vibrator when an alternating current voltage having a phase that is different by ./2 in the neighborhood of 160 kHz is applied;

FIGS. 9A, 9B, and 9C explain the movement of the entire vibration wave linear motor when the vibrator unit self-runs along the two guide shafts between both of ends of the guide shafts, and moves forward and backward;

FIG. 10A is a perspective view explaining a method linking the vibration wave linear motor and a third mobile lens frame;

FIG. 10B is an enlarged perspective view showing only the linked portion;

FIG. 10C is an enlarged view showing a magnetic sensor unit detecting the move amount of the third movable lens frame;

FIG. 14A is a cross-sectional view of FIG. 13 when taken along C-C';

FIG. 14B is a cross-sectional view showing FIG. 14A when taken along an arrow line D-D';

FIG. 15A is a schematic showing a basic form of an engagement of a driving contacting part and a guide shaft;

FIGS. 15B to 15E respectively show its modification examples (No. 1);

FIG. 16A again shows a basic form of the contact engagement of a driving contacting part and a guide shaft;

FIGS. 16B to 16F respectively show its modification examples (No. 2);

FIGS. 18A and 18B are schematics (No. 1) explaining a contact engagement form of driving contacting parts and guide shafts, and the running characteristic of a vibrator in an arrangement configuration of a vibrator, driving contacting parts, and guide shafts;

FIGS. 20A and 20B are schematics (No. 3) explaining a contact engagement form of driving contacting parts and guide shafts, and the running characteristic of a vibrator in an arrangement configuration of a vibrator, driving contacting parts, and guide shafts;

FIGS. 22A and 22B are schematics (No. 5) explaining a contact engagement form of driving contacting parts and guide shafts, and the running characteristic of a vibrator in an arrangement configuration where a vibrator, driving contacting parts, and guide shafts; and FIGS. 23A and 23B are schematics (No. 6) explaining a contact engagement form of driving contacting parts and guide shafts, and the running characteristic of a vibrator in an arrangement configuration of a vibrator, driving contacting parts, and guide shafts.

DESCRIPTION OF THE PREFERRED EMBODIMENTS

First Preferred Embodiment

A preferred embodiment according to the present invention is described below with reference to the drawings.

<Lens Apparatus Comprising a Vibration Wave Linear Motor>

Figure 1A:
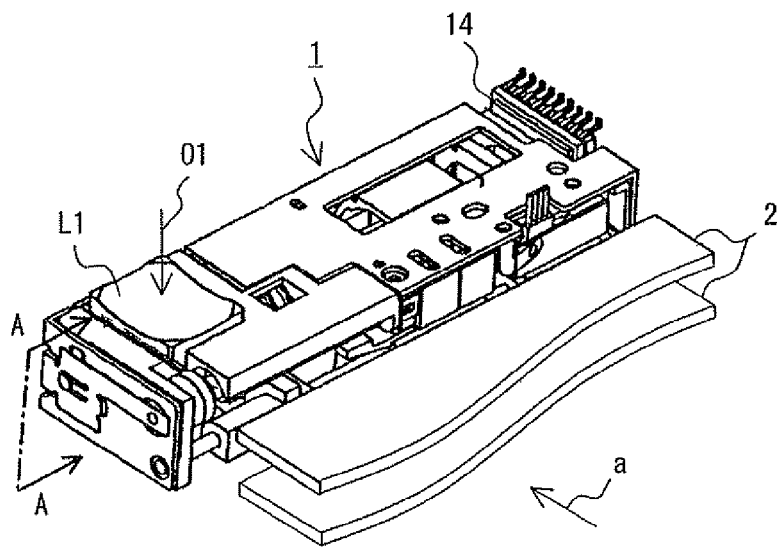
FIG. 1A is a perspective view showing the outer appearance of a lens apparatus comprising a vibration wave linear motor according to the present invention.
Figure 1B:
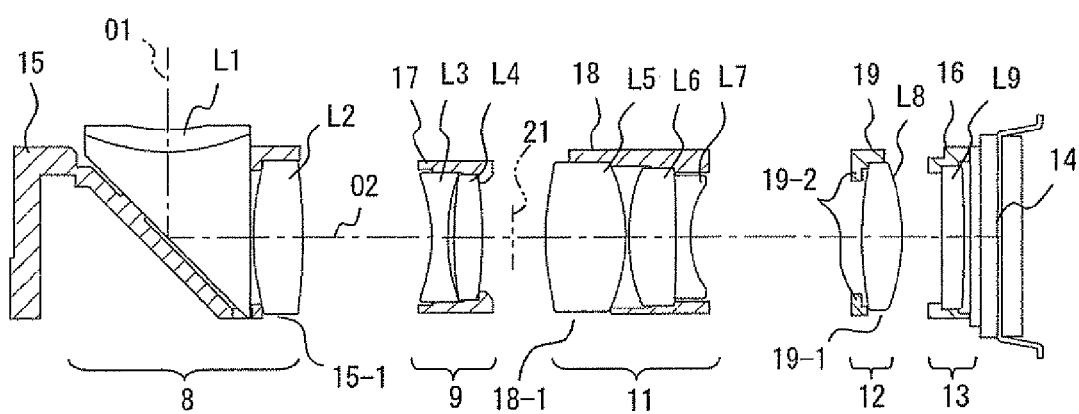

FIG. 1A is a perspective view showing the outer appearance of a lens apparatus comprising a vibration wave linear motor according to the present invention, whereas FIG. 1B is a cross-sectional view, taken along an arrow line A-A', of the lens apparatus shown in FIG. 1A when viewed in the direction of an arrow a in FIG. 1A, and shows a simplified configuration of respective lens units.

FIG. 1A also shows a portion of a circuit board 2 comprising a control circuit which controls the driving of respective units of the lens apparatus 1 assembled within the housing of a main body apparatus such as a camera, etc. along with the lens apparatus 1.

The lens apparatus 1 shown in FIG. 1A reflects a pencil of light from a subject, which is incident from a shooting lens window of the housing of a main body apparatus not shown to a lens L1 along a shooting optical axis O1 (indicated by the vertical direction in FIG. 1), to be bent almost at a right angle in the horizontal direction (an obliquely upper right direction in FIG. 1) by using a prism formed integrally with the lens L1. This lens apparatus 1 generates a captured image by guiding the incident pencil of light to an image capturing element 14, which is provided at the end (the end in the obliquely upper right direction in FIG. 1) of the lens apparatus 1 and configured, for example, by a CCD, etc., along the bent second optical axis O2 shown in FIG. 1B.

As shown in FIG. 1B, the lens apparatus 1 includes a plurality of lenses configured by a first fixed lens unit 8 composed of lenses L1 and L2, a first movable lens unit 9 composed of lenses L3 and L4, a second movable lens unit 11 composed of lenses L5, L6, and L7, a third movable lens unit 12 composed of a lens L8, and a second fixed lens unit 13 composed of a lens L9, along the second optical axis O2 bent in the horizontal direction. Additionally, the image capturing element 14 is arranged at the dead end of these lens groups.

The lens L1 of the first fixed lens unit 8 is formed integrally with a prism that changes the course of the pencil of light along the second optical axis O2 by reflecting the pencil of light from the subject, which is incident from the above described shooting lens window along the shooting optical axis O1, to be bent almost by 90° in the horizontal direction. The lens L1 is held by a first fixed lens frame unit 15 along with the lens L2, and fixed within the lens apparatus 1.

The first fixed lens frame unit 15 and the second fixed lens frame unit 16 are integrally formed by being molded with resin at the end of a metal frame, which will be described later and has an almost L-shaped cross section cut vertically with reference to the second optical axis O2, in a long side direction.

Between the first fixed lens frame unit 15 and the second fixed lens frame unit 16, a first movable lens frame 17 holding the first movable lens unit 9, a second movable lens frame 18 holding the second movable lens unit 11, and a third movable lens frame 19 holding the third movable lens unit 12 are arranged.

The first movable lens frame 17, the second movable lens frame 18, and the third movable lens frame 19 respectively hold the first movable lens unit 9, the second movable lens unit 11, and the third movable lens unit 12 to be independently movable along the second optical axis O2 that is bent almost at the right angle by the lens L1 (also referred to as the prism L1 hereinafter).

The first movable lens unit 9 and the second movable lens unit 11 are provided to change the focal distance of the pencil of light of the subject, which is incident along the second optical axis O2 of the optical system of the lens apparatus 1. In other words, the first movable lens frame 17 and the second movable lens frame 18, which respectively hold the first movable lens unit 9 and the second movable lens unit 11, are provided to adjust the zoom ratio of the lens system.

Additionally, the third movable lens unit 12 is provided to adjust a focus at which the pencil of light forms an image on the image capturing unit 14. In other words, the third movable lens frame 19 holding the third movable lens unit 12 is provided as a lens frame for achieving a focus, which can freely move in the direction of the second optical axis O2.

Furthermore, 21 between the first movable lens unit 9 and the second movable lens unit 11 indicates a position of an aperture.

Still further, in this lens unit, frame cut parts 15-1, 18-1, and 19-1 are formed by cutting a portion or the whole of frame walls (portions corresponding to the bottoms of the lenses in a lower portion in the example shown in FIG. 1B), in either of the upper and lower portions of the second optical axis O2, of the first fixed lens frame unit 15, the second movable lens frame 18, and the third movable lens frame respectively holding the first fixed lens unit 8, the second movable lens unit 11, and the third movable lens unit 12, which respectively include the lenses L2, L5, and L8 of relatively large diameters, in order to make the thickness in the direction of height (actually, a thickness in the direction of depth as a lens unit for shooting) as thin as possible.

For the second and the third movable lens frames 18 and 19, the strengths of which become weak by the amount of the cut frame walls, and which do not have another reinforced portion unlike the first fixed lens frame 15, a convex part which protrudes externally and will be described later, is provided on a side opposite to the cut parts with reference to the second optical axis O2, namely, on the frame walls on the top surface. The reason why the frame walls of the second and the third movable lens frames 18 and 19 on the top surface look slightly thick in FIG. 1B is that the cross sections of the convex parts are depicted.

Additionally, since the whole of the third movable lens frame 19 is thin and weak in the direction of a width, it can be possibly insufficient to make reinforcement only with the above described convex parts. Therefore, a protruding part 19-2 is provided to wrap from a lens barrel part formed on a side opposite to the cut part 19-1 formed at the bottom of the lens L8 toward the left hand side, which is out of range of the effective light beam of the lens L8.

FIG. 2 is a perspective view showing the disassembly of the lens apparatus 1 when viewed from upward.

Figure 3:
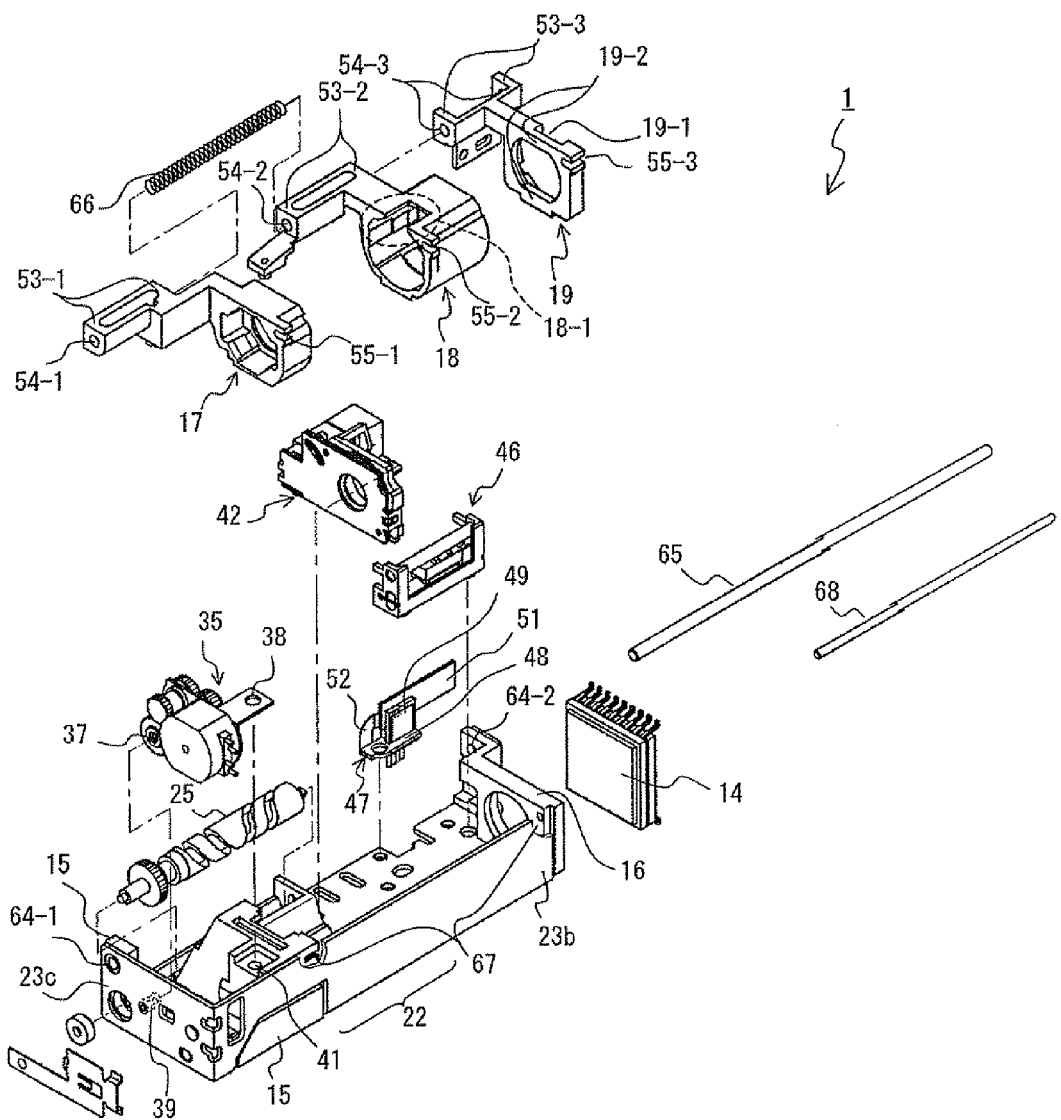
FIG. 3 is a perspective view showing the disassembly of the lens apparatus upside down when viewed from downward.

FIG. 3 is a perspective view showing the disassembly of the lens apparatus 1 upside down when viewed from downward. In FIGS. 2 and 3, the same constituent elements as those shown in FIGS. 1A and 1B are denoted with the same reference numerals.

As shown in FIGS. 2 and 3, the lens apparatus 1 comprises a main fixed lens frame 22. When all of the constituent elements shown in FIG. 2 or 3 are assembled and accommodated inside and outside the main fixed lens frame 22, the whole of the lens apparatus 1 has an outer shape, shown in FIG. 1A, of the main body of the apparatus where the constituent elements are comprised on two main surfaces of opposed rectangles, and included in a flat space enclosed by the two main surfaces.

The above described main fixed lens frame 22 comprises a metal frame 23a forming at least one of the above described 2 main surfaces. In the configuration of this lens apparatus 1, the other main surface is made open. Also one side surface of the flat space enclosed by the one main surface formed by the metal frame 23a and the other open main surface is configured by a metal frame 23b provided almost at a right angle from the metal frame 23a being the one main surface.

Additionally, also one side surface in the short side direction (the side surface in the obliquely lower left short side direction in FIGS. 2 and 3) is configured by a metal frame 23, which is almost perpendicular to the metal frame 23a being the main surface, and the metal frame 23b being the side surface in the long side direction.

In this way, the metal frames 23 (23a, 23b) configure an L-shaped metal frame whose cross section perpendicular to the long side direction (also the above described bent direction of the second optical axis O2) is composed of one main surface and one side surface in the long direction, and a frame having an ideal structure implementing high rigidity with a small amount of a material.

At both ends of the metal frame 23 in the long side direction, a fixed molded part formed integrally with the metal frame 23 by using outsert molding is respectively formed. These two fixed molded parts are the first fixed lens frame unit 15 and the second fixed lens frame unit 16, which are also shown in FIG. 1B.

In the first fixed lens frame unit 15, the prism L1 also shown in FIG. 1B, and the lens L2 not shown in FIGS. 2 and 3 are held and fixed. Additionally, in the second fixed lens frame unit 16, the lens L9 which is shown in FIG. 1B but not shown in FIGS. 2 and 3 is held and fixed.

Between the first fixed lens frame unit 15 and the second fixed lens frame unit 16, the 3 movable lens frames (the first movable lens frame 17, the second movable lens frame 18, and the third movable lens frame 19), which are also shown in FIG. 1B, are arranged.

In the three movable lens frames and the two fixed lens frames, an adhesive storing part 24 (see FIG. 2), which prevents an adhesive holding and fixing a lens from overflowing. The adhesive storing part 24 is a tiny space formed between the round surface of the fixed lens and the lens frame.

Adhesive storing parts of the third movable lens frame 19 and the second fixed lens frame unit 16 are not shown in FIGS. 2 and 3 because they are hidden. An adhesive storing part of the first fixed lens frame unit 15 is provided in a portion corresponding to the side surface of the prism formed integrally with the lens L1, although this is not shown.

Before the above described three movable lens frames are assembled, a zooming shaft cam 25 is arranged adjacently to the side surface of the main fixed lens frame 22 on the open side in the long side direction, and to the side surface of the first fixed lens frame unit 15. The zooming shaft cam 25 comprises a large diameter part forming a round surface on which cam grooves of a cam unit is provided, and small diameter parts 26 (26a, 26b) that are provided to protrude from both of the ends of the large diameter part on the shaft. In the small diameter part 26a that is provided to protrude at the end on the side opposite to the image capturing element 14, a gear 27 is fixed.

After the small diameter part 26a of the zooming shaft cam 25 is inserted into a shaft bearing insertion hole 28 formed in a part bonded integrally with the metal frame 23c of the first fixed lens frame unit 15, the other small diameter part 26b is inserted into a shaft bearing hole which is hidden and not shown, and formed in the first fixed lens frame unit 15 while pulling the zooming shaft cam 25 in the obliquely right direction in FIG. 2, so that the small diameter part 26a is engaged with a shaft bearing 29 in the shaft bearing insertion hole 28. As a result, the zooming shaft cam 25 is held to be rotatable for the first fixed lens frame unit 15.

At the tip of the small diameter part 26a of the zooming shaft cam 25, a convex part 31 having a smaller diameter is formed. The convex part 31 externally protrudes upward from the shaft bearing 29 when the small diameter part 26a engages with the shaft bearing 29. This convex part 31 is pressed by a pressing board spring 32, whereby the zooming shaft cam 25 is aligned by the upper and the lower shaft bearings to be stably supported.

The pressing board spring 32 is configured by: 3 bent leg parts 32-1 formed by separating a portion of each leg with a notch from an almost square main body, by being bent downward, and by bending the tip to be horizontal; a stop section 32-2 formed by cutting the center of the main body; and a pressing spring part 32-3 formed by being extended integrally from the main body.

In the meantime, on the side of the metal frame 23c, 3 notches 33 are formed in positions corresponding to the 3 bent leg parts 321 of the pressing board spring 32, and a convex part 34 corresponding to the stop section 32-2 of the pressing board spring 32 is formed almost at the center enclosed by the 3 notches 33.

When the main body of the pressing board spring 32 is pushed into the side of the metal frame 23c while engaging the 3 bent leg parts 32-1 of the pressing board spring 32 with the 3 notches 33 of the metal frame 23c, the tip of the stop section 32-2 engages with the round surface of the convex part 34. As a result, the pressing board spring 32 is fixed on the outer surface of the metal frame 23c, and the convex part 31 of the zooming shaft cam 25 is pressed by the tip of the pressing spring unit 32-3, so that the zooming shaft cam 25 is aligned.

As a result, the zooming shaft cam 25 is arranged in the neighborhood of the prism L1 held by the first fixed lens frame unit 15 to be orientated in the long side direction of the main fixed lens frame 22, namely, in parallel with the second optical axis O2, and arranged so that at least a portion in the shaft direction is adjacent to the side surface of the prism L1.

Then, a zooming motor unit 35 is arranged in a space (see FIG. 3) shaped almost like a triangle pole, which is formed by a slope of the first fixed lens frame unit 15 holding the back side of the reflection plane of the lens (prism) L1, and the metal frame 23c, and its reduction gear train 36 engages with the gear 27 of the zooming shaft cam 25. The zooming motor unit 35 is fixed to the first fixed lens frame unit 15 by securing with screws two securing parts (see FIG. 3) of a gear shaft fixing part 37 and a stop board fixing part 38 to an alignment hole 39 formed on the first fixed lens frame unit 15 and to a stop hole 41.

Then, an aperture/shutter unit 42 is assembled to the main fixed lens frame 22. The aperture/shutter unit 42 (see FIG. 2) comprises an aperture/shutter part 43 having an aperture which controls the amount of passing light of reflection light forming the second optical axis O2, and a shutter, and rotary solenoids 44 and 45 which respectively drive the aperture and the shutter of the aperture/shutter part 43 in a mechanical manner.

The aperture/shutter part 43 is arranged in the position 21 of the aperture shown in FIG. 1B, and the two rotary solenoids 44 and 45 are arranged below the zooming shaft cam 25.

Furthermore, a vibration wave linear motor 46 for moving and driving the third movable lens frame 19, and a magnetic sensor unit 47 are aligned to overlay in the short side direction of the main fixed lens frame 22 below the aperture/shutter unit 42.

As a result, the vibration wave linear motor 46 is arranged in the position in the direction where the shaft of the zooming shaft cam 25 is extended, and on the side of the image capturing surface.

The magnetic sensor unit 47 (see FIG. 3) comprises a magnetic sensor holder 48, a magnetic sensor 49, a magnetic scale 51, and a pressing spring 52.

The above described vibration wave linear motor 46 and magnetic sensor unit 47 will be described in detail later.

After the above described members are arranged in this way, the first movable lens frame 17, the second movable lens frame 19, and the third movable lens frame 19, to which the movable lens units 9, 11, and 12 shown in FIG. 1B (but not shown in FIGS. 2 and 3) are respectively fixed with an adhesive, are assembled.

The top and the bottom (the top and the bottom also in FIG. 1B) of each of the lenses L3 to L8 of the movable lens units 9, 11, and 12, which are respectively held by the first movable lens frame 17, the second movable lens frame 18, and the third movable lens frame 19 and shown in FIG. 1B, for the lens apparatus 1 shown in FIG. 1A are cut, and the top and the bottom surfaces form flat surfaces, and the lenses are shaped like an oval when viewed at the front, although this is not clearly shown in FIG. 1B because it is the cross-sectional side view.

Additionally, the top and the bottom surfaces (the top and the bottom of the lens apparatus 1 shown in FIG. 1A, and the top and the bottom of the lens unit shown in FIG. 1B) along the second optical axis O2 are formed to be flat so that the circumferences of the lens holding units of the first, the second, and the third movable lens frames 17, 18, and 19 hold the oval-shaped lens. This leads to a reduction in the thickness of the movable lens frames embedded in the lens apparatus 1.

For a further reduction in the thicknesses of the second and the third movable lens frames 18 and 19, frame walls, which correspond to the flat surfaces of the bottoms of the lenses, of the bottoms (the bottom portions in FIG. 2, and the top portions in FIG. 3) of the lens frames holding the lenses are cut to form cut parts 18-1 and 19-1, which are shown in FIG. 1B, and the flat parts of the bottoms of the lenses are exposed.

The above described cut part of the second movable lens frame 18 is shown in FIGS. 2 and 3. However, the cut part of the third movable lens frame 19 is not shown because it is hidden by the remaining peripheral portion of the lens frame.

The first movable lens frame 17, the second movable lens frame 18, and the third movable lens frame 19 (see FIG. 2) respectively comprise shaft bearing parts 53 (53-1, 53-2, 53-3), in which guide holes 54 (54-1, 54-2, 54-3) are respectively provided.

Additionally, the first movable lens frame 17, the second movable lens frame 18, and the third movable lens frame 19 respectively comprise U-shaped cut parts 55 (55-1, 55-2, 55-3) at ends as opposed to the shaft bearing parts 53 (see FIG. 3).

Furthermore, a light reflecting member 59 is attached and arranged in a stage height part 58 formed in a boundary between a front outer surface 56 (see FIG. 2) as opposed to the back end portion, which has the above described shaft bearing parts 53 and the U-shaped cut parts 55-1 (see FIG. 3), and a side surface 57 where the shaft bearing parts 53 of the first movable lens frame 17 are arranged.

Still further, cam followers 61 (61-1, 61-2) are respectively formed in a portion which is provided to protrude at the side integrally with the shaft bearing part 53-1 of the first movable lens frame 17, and in a portion which is provided to extend integrally with the shaft bearing part 53-2 of the second movable lens frame 18.

Still further, a light reflecting member 62 is attached to a side surface that is provided to be erected in the horizontal direction integrally with the shaft bearing part 53-3 of the third movable lens frame 19.

Still further, convex parts 63 (63-2, 63-3) for reinforcement, which are explained with reference to FIG. 1B, are formed on the outer surface on the front end as opposed to the back end having the shaft bearing parts 53 and the U-shaped cut parts 55.

These convex parts 63 are provided to reinforce the strengths of the lens frames, which are insufficient due to the cut wall frames corresponding to the back flat portions of the oval lenses in order for a reduction in the thickness of the entire apparatus.

Additionally, a first guide shaft 65, both ends of which are supported by guide shaft supporting holes 64 (64-1, 64-2) formed at corners respectively closest to the open side surface and the open main surface of the first fixed lens frame unit 15 and the second fixed lens frame unit 16, is inserted into guide holes 54 of the three movable lens frames.

Figure 13:
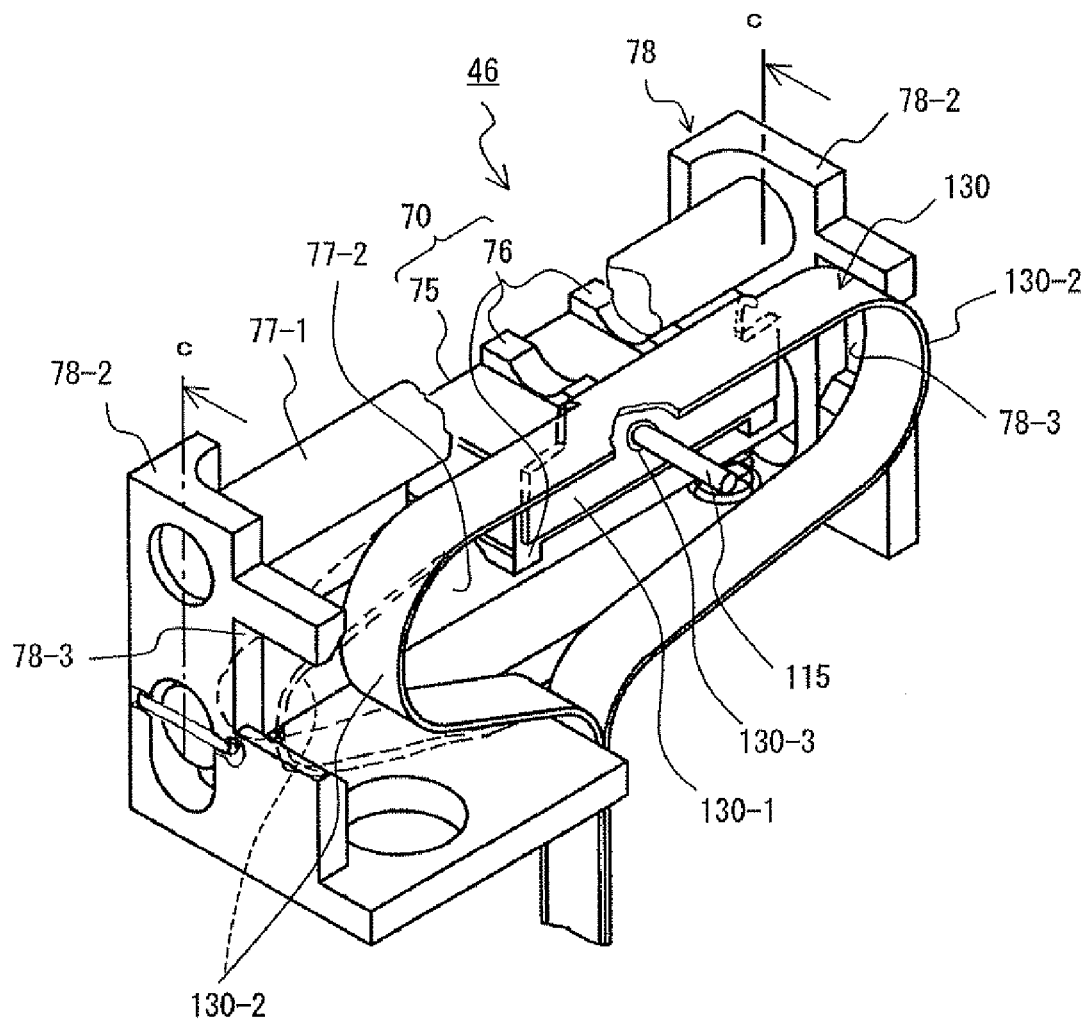
FIG. 13 is a perspective view showing the vibration wave linear motor, and a flexible board arranged between external electrodes of the vibrator and the driving circuit.

As a result, the first, the second, and the third movable lens frames 17, 18, and 19 (namely, the 3 movable lens units 9, 11, and 12) are supported to be movable in the direction of the second optical axis O2 shown in FIG. 13.

Furthermore, the guide shaft supporting holes (64-1, 64-2) supporting the first guide shaft 65 are formed at the corners closest to the open side surface and the open main surface, whereby the first guide shaft 65 is arranged to be as close as possible to an outermost portion, in which the open side surface and the open main surface join, within the lens apparatus 1 formed b the main fixed lens frame 22. The first guide shaft 65, which is arranged to be as close as possible to the outermost portion, is supported by the shaft bearing parts 53, whereby the 3 movable lens frames are arranged within the narrow and flat main body of the apparatus without wasting space.

When the first guide shaft 65 is inserted, a compressed spring 66 having pressing force is externally attached to the first guide shaft 65 between the shaft bearing part 53-1 of the first movable lens frame 17 and the shaft bearing part 53-2 of the second movable lens frame 18.

Additionally, a second guide shaft 68 is arranged by supporting its both ends with other 2 guide shaft supporting holes 67 (see FIG. 3) formed in positions, which are closest to the closed side surface and the open main surface configured by the metal frame 23b, of the first fixed lens frame unit 15 and the second fixed lens frame unit 16, before the 3 movable lens frames are assembled.

The respective movable lens frames are rotated inside by using the second guide shaft 68 as a pivot line after the above described U-shaped cut parts 55 are supported to freely slide by fitting into the second guide shaft 68 horizontally, whereby the cam followers 61 provided in the first movable lens frame 17 and the second movable lens frame 18 freely and smoothly penetrate into the cam grooves of the zooming shaft cam 25 to engage with, when the 3 movable lens frames are assembled.

Namely, cams (the cam grooves with which the cam followers 61-1 and 61-2 engage), which respectively correspond to a plurality of lens frames (the first movable lens frame 17 and the second movable lens frame 18 in this example) are respectively formed in the zooming shaft cam 25.

The cam followers 61 penetrate into the cam grooves of the zooming shaft cam 25 as described above, whereby the zooming shaft cam 25, and the first movable lens frame 17 and the second movable lens frame 18 engage with each other to freely slide.

Additionally, the top outer surface 56 (see FIG. 2) of the first movable lens frame 17 is arranged to be close to the back side of the metal frame 23a forming one main surface, and the convex parts 63 for reinforcement, which are formed on the front outer surfaces of the second movable lens frame 18 and the third movable lens frame 19, penetrate into an opening part 69 also formed on the metal frame 23a.

This opening part 69 forms an opening which is vertically long according to the move stroke of a movable lens in order to avoid an interference with the move of a movable lens (see the lenses L5 to L8 shown in FIG. 1B) that moves with the move of the second movable lens frame 18 or the third movable lens frame 19, namely, in order not to prevent the convex parts 63 from moving.

Hereafter, the above described first guide shaft 65 is inserted into the guide hole 54 of the shaft bearing parts 53 of the movable lens frames, and the guide shaft supporting holes 64 at both of the ends. As a result, the two guide shafts (65, 68) are arranged to be adjacent to the zooming shaft cam 25 and in parallel with the shaft of the zooming shaft cam 25.

As described above, the shaft members are arranged to be adjacent and in parallel, which contributes to a reduction in the size of the entire apparatus.

By being supported by the two guide shafts, the three movable lens frames (17, 18, 19) are controlled to be able to slide in the direction of the optical axis O2, prohibited by one of the guide shafts from rotating about the other, and aligned in a direction perpendicular to the optical axis O2, so that the movable lens frames are arranged within the main fixed lens frame 22.

Additionally, the compressed spring 66 is arranged between the shaft bearing part 53-1 of the first movable lens frame 17 and the shaft bearing part 53-2 of the second movable lens frame 18 by being externally attached to the first guide shaft 65, whereby the first movable lens frame 17 and the second movable lens frame 18 are pressed in the mutually reverse directions.

As a result, the cam followers 61-1 and 61-2, which respectively engage with the cam grooves of the zooming shaft cam 25, are respectively pressed against the opposite sides of the wall of the cam grooves of the zooming shaft cam 25. Accordingly, a play occurring between the cam grooves and the cam followers when the zooming shaft cam 25 is driven to rotate is eliminated. As a result, a position relationship when the lens frames move to the left or the right is properly controlled.

In the above described arrangement, the first guide shaft 65 is arranged to be adjacent and almost in parallel with the zooming shaft cam 25.

Hereafter, the image capturing element 14 is installed on the bottom surface of the second fixed lens frame unit 16. Additionally, a photosensor installment hole 71 is provided in a position, which corresponds to the light reflecting member 59 attached to the first movable lens frame 17, on the surface of the first fixed lens frame unit 15, which exists on the same surface of the metal frame 23a. A photosensor 72 is arranged in this photosensor installment hole 71.

This photosensor 72 detects the absolute position of the first movable lens frame. The move distance of the first movable lens frame from the detected absolute position is determined in a way such that the number of steps of a zoom motor of a zooming motor unit 35, which is driven in steps, is counted by a control device not shown.

Additionally, another photosensor 73 is arranged in a position, which corresponds to the light reflecting member 62 attached to the third movable lens frame 19, on a side facing the open side surface of the second lens frame unit 16. This photosensor 73 detects the absolute position of the third movable lens frame 19 by detecting the light reflected from the light reflecting member 62 attached to the third movable lens frame 19.

After these absolute positions are determined, the zooming shaft cam 25 rotates in both forward and backward directions within a predetermined angle range by means of the forward and backward rotations of the motor of the zooming motor unit 35. The cam follower 61-1 of the first movable lens frame 17, and the cam follower 61-2 of the second movable lens frame 18 respectively engage with the two cam grooves provided on the outer round surface of the zooming shaft cam 25, whereby the first movable lens frame 17 and the second movable lens frame 18 (namely, the first movable lens unit 9 and the second movable lens unit 11) move close to or apart from each other in the direction of the second optical axis O2. As a result, the image of the pencil of light proceeding in the direction of the optical axis O2 is zoomed in/out.

Additionally, the aperture/shutter unit 42, where the aperture/shutter part 43 is arranged in the aperture position 21 between the first and the second movable lens units 9 and 11 in FIG. 1B, opens/closes the course of the pencil of light proceeding in the direction of the optical axis O2, and an optical filter (ND filter) that controls the amount of light on the image capturing surface is moved forward and backward within the course of the pencil of light.

A vibration wave linear motor that drives the move of the third lens frame holding the third movable lens unit 12 for achieving a focus is described next.

<Entire Configuration of the Vibration Wave Linear Motor>

Figure 4A:
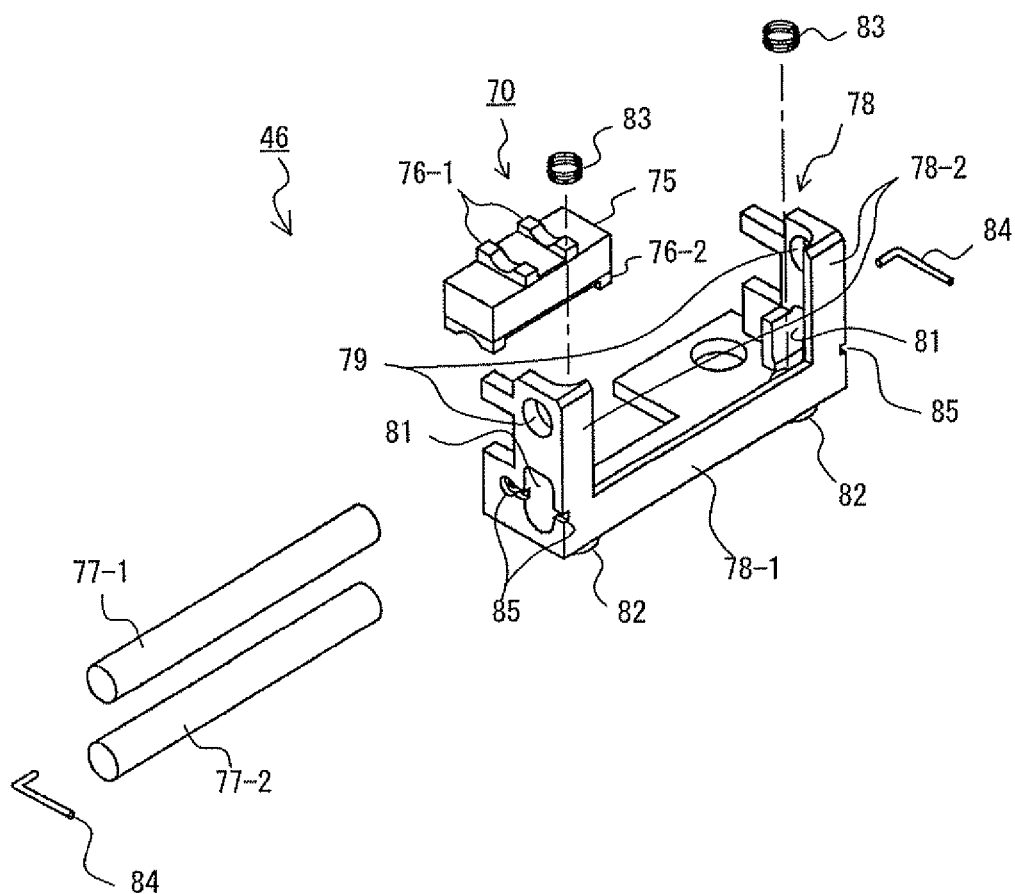
FIG. 4A is a perspective view showing the disassembly of an ultrasonic linear motor according to one preferred embodiment.
Figure 4B:
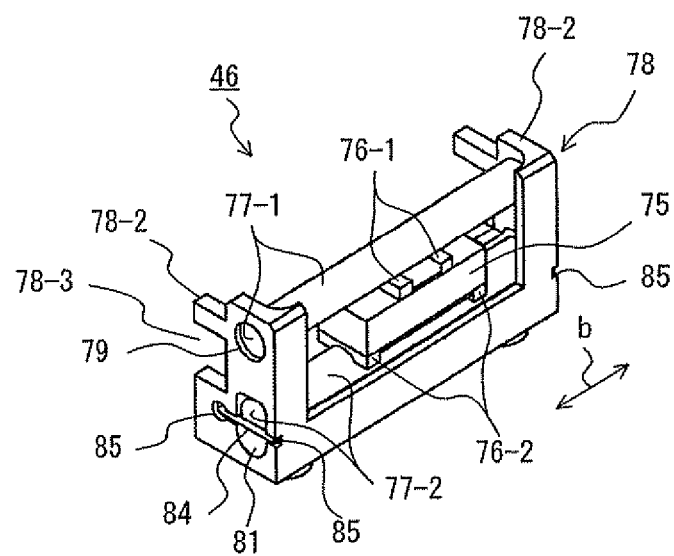
FIG. 4B is a perspective view showing the assembled state of the ultrasonic linear motor shown in FIG. 4A.

FIG. 4A is a perspective view showing the disassembly of the vibration wave linear motor used in this preferred embodiment, whereas FIG. 4B is a perspective view showing its assembled state. As shown in FIGS. 4A and 4B, the vibration wave linear motor 46 comprises a vibrator composed of a vibrator unit 75 shaped like a rectangular parallelepiped, and pluralities (respectively two in this figure) of protruding contacting parts 76 (76-1, 76-2), which are formed integrally with or separately from the vibrator unit 75 on opposed two top and bottom surfaces of the vibrator unit 75.

The vibrator unit 75 is shaped like a rectangular parallelepiped without concave and convex portions as described above, whereby the entire motor can be easily reduced in size. Additionally, the driving contacting parts 76 are comprised on the opposed two surfaces, whereby high driving force can be delivered.

The vibration wave linear motor 46 further comprises two guide shafts 77 (77-1, 77-2) guiding the self-running move of the vibrator 70 by sandwiching the vibrator unit 75 in parallel with the move direction via the driving contacting parts 76 of the vibrator 70, and supporting parts 78 supporting the entire vibrator while aligning the round-bar-state two guide shafts 77. The driving contacting parts 76 are formed to protrude respectively in the directions of the guide shafts 77 on their arrangement surfaces.

In the supporting part 78, fixed shaft bearing holes 79 supporting the upper guide shaft 77-1 among the two guide shafts 77 by attaching and fixing the member are formed in upper portions of erecting parts 78-2, which are formed integrally with a base part 78-1 from both ends of the base part 78-1. Under the holes 79, shaft bearing long holes 81 supporting the lower guide shaft 77-2 to freely move up and down are formed. In the erecting parts 78-2 of the supporting part 78, open parts 78-3 are formed at the side of supporting the two guide shafts 77.

Additionally, at the bottom surface in the neighborhoods of both of the ends of the base part 78-1 of the supporting part 78, convex parts 82 are respectively provided in positions, which correspond to both of the ends of the lower guide shaft 77-2 inserted in the shaft bearing long holes 81. The convex parts 82 are hollow when viewed from upward although this is not shown, and spiral (coil) springs 83 having pressing force are held in the hollow portions.

Furthermore, the top ends of the spiral springs 83, which protrude upward from the hollow portions, press the lower guide shaft 77-2 in the neighborhoods of both of its ends, namely, toward the upper guide shaft 77-1. As a result, the lower guide shaft 77-2 is pressed against the driving contacting parts 76 on the bottom surface of the vibrator 70, which the lower guide shaft 77-2 sandwiches along with the upper guide shaft 77-1, and supported by the shaft bearing long holes 81 to be movable up and down by means of a vibration of the vibrator 70, which will be described later, and the pressing force of the spiral springs 83.

The lower guide shaft 77-2 is supported by the shaft bearing long holes 81 to be movable up and down as described above, whereby an assembly error between the guide shafts 77 can be easily absorbed, and the entire apparatus can be easily reduced in size.

Additionally, the lower guide shaft 77-2 is pressed with the spiral springs 83 in the neighborhoods of both of the ends of the lower guide shaft 77-2, whereby the lower guide shaft 77-2 can be evenly pressed against the vibrator 70 over the entire proceeding direction of the vibrator 70. Accordingly, the driving contacting parts can be stably pressed against the guide shafts 77 all the time in whichever position the vibrator exists. As a result, the stable forward and backward move of the vibrator 70 can be implemented.

Here, the upper and the lower guide shafts are referred to as the two guide shafts 77. However, the lower guide shaft 77-2 may be an upper guide shaft depending on a position relationship when being assembled in the lens apparatus 1. Or, if the lens apparatus 1 is rotated from the state shown in FIG. 1B, the two guide shafts 77 may be the left and the right members, or front and back members.

Furthermore, the pressing members, which press the neighborhoods of both of the ends of the lower guide shaft 77-2 in the direction of the upper guide shaft 77-1, are not limited to the spiral springs 83. Board springs, magnets, etc. may be available. Additionally, the lower guide shaft 77-2 is not limited to being pressed in the direction of the upper guide shaft 77-1 with the pressing force, and may be drawn in the direction of the upper guide shaft 77-1 with drawing force.

Next, drop preventing pins 84 are arranged by making the pins abut on both of the ends of the lower guide shaft 77-2 that is inserted into the shaft bearing long holes 81 in order to prevent the lower guide shaft 77-2, which can freely move up and down, from dropping or falling away. Both ends of the drop preventing pins 84 are adhered and secured to pin fixing grooves 85 formed on the outer surface of the shaft bearing long holes 81. The lower guide shaft 77-2 is prevented from dropping or falling away by the above described drop preventing pins 84, and its reaction move when the vibrator 70 makes a reverse move is restricted.

The above described vibrator 70 moves forward and backward between the erecting parts 78-2 at both of the ends in a direction in parallel with the guide shafts 77-1 and 77-2, which is indicated by a bidirectional arrow b shown in FIG. 4B, with a specific vibration to be described later, and the operations of the driving contacting parts 76 and the two guide shafts 77-1 and 77-2.

In the above described driving contacting parts 76, concave cut parts, which have various shapes, for being properly guided (or restricted) by the first and the second guide shafts 77 are provided on surfaces contacting the first and the second guide shafts 77. As a result, the move direction of the vibrator 70 is restricted to only a direction along the first or the second guide shaft 77 via the driving contacting parts 76, although details will be described later.

As described above, the guide shafts 77 forming the move path of the vibrator 70 restrict also the move direction of the vibrator 70 via the driving contacting parts 76. Additionally, since 3 or more driving contacting parts 76 are arranged, also the rotation of the vibrator 70 on a plane space formed by the first and the second guide shafts 76 and 77 is restricted. This eliminates the need for providing a rotation stopper of the vibrator 70, thereby simplifying the configuration.

In the vibration wave linear motor 46 which is shown in FIG. 4B and referred to in this embodiment, the vibrator 70 self-runs along the two guide shafts 77 as described above. However, for example, if a member sandwiching both of the ends of the vibrator 70 in the move direction is arranged and fixed to a frame, the supporting part 78 that supports the two guide shafts 77 is to move, and the vibrator 70 and the two guide shafts 77 have a relationship of a relative move. This will be described in detail later.

<Configuration of the Vibrator>

FIG. 5A is a front view of the vibrator 70 of the above described vibration wave linear motor 46. FIG. 5B shows its side view. FIG. 5C shows an arrangement of piezoelectric sheets and electrodes of the vibrator 70 shown in FIGS. 5A and 5B.

FIG. 5A shows the vibrator 70 upside down from the cases shown in FIGS. 4A and 4B. FIG. 5A shows also electrodes wired to the vibrator unit 75, which are not shown in FIGS. 4A and 4B.

As shown in FIGS. 5A and 5B, the vibrator 70 comprises: the vibrator unit 75 configured by a piezoelectric sheet layer 87 composed of stacked piezoelectric sheets 86, and an elastic sheet layer 89 composed of elastic sheets 88 stacked below the piezoelectric sheet layer; and pluralities (a total of 4 units in this example) of driving contacting parts 76 respectively arranged on two opposed surfaces in the stacking direction of the piezoelectric sheets 86 of the vibrator unit 75.

The above described vibrator unit 75 is manufactured by annealing the stacked piezoelectric sheets 86 and elastic sheets 88, and by performing poling.

In the driving contacting parts 76, a concave cut part 76a is provided. The concave cut part 76a has various shapes, although this will be described later.

Insulation sheets 91 are respectively attached to the top surface of the piezoelectric sheet layer 87 and the bottom surface of the elastic sheet layer 89. As an insulation sheet 91, the same member as an elastic sheet 88, which is originally an insulation material, may be available.

The above described driving contacting parts 76 are respectively formed by being made to closely contact the outside surfaces of the insulation sheets 91. Additionally, the respective 2 driving contacting parts 76 are formed not alone but integrally with a flat board part 92 configured by a board member, so that the two driving contacting parts 76 form a coupled driving contacting part 93 (not the whole but the two driving contacting parts 76 form a contacting unit). Note that the coupled driving contacting part 93 is formed separately from the vibrator unit 75.

The driving contacting parts 76 are formed as a coupled driving contacting part 93 as described above, whereby the efficiency of assembly can be increased in comparison with a case where a plurality of driving contacting parts 76 are separately assembled. However, it is not always necessary to configure the driving contacting parts 76 as the coupled driving contacting parts 93 on both of the surfaces. Configuring only one coupled driving contacting part 93 with driving contacting parts on either of the surfaces can contribute to improvements in the efficiency of assembly.

Preferably, the coupled driving contacting part 93 is made of a resinous material obtained by scattering and solidifying abrasive grains such as alumina powder, etc. Since the acoustic impedance of this material is lower than those of the other portions of the vibrator 70, most parts other than the coupled driving contacting part and close to a longitudinal vibration or a flexion vibration, which will be described later, are excited, leading to the facilitation of design.

Furthermore, a material having both hardness and elasticity is selected as the material of the coupled driving contacting part 93, whereby the part can be easily made to vibrate along with the vibrator unit 75, and its abrasion resistance is improved. This contributes to improvements in the durability of the vibration wave linear motor 46.

Additionally, preferably, the size of the flat board part 92 of the coupled driving contacting part 93 is formed to match the surface of the vibrator unit 75 (it is preferable that the surfaces of the coupled driving contacting part 93 and the vibrator unit 75, which are attached to each another, are identical in shape and size. Namely, it is preferable that the bottom surface of the coupled driving contacting part 93 is the same as that of the vibrator unit, to which the coupled driving contacting part 93 is to be attached).

In this way, alignment is facilitated when the coupled driving contacting part 93 is attached to the vibrator unit 75, thereby improving the efficiency of assembly operations. If only one end of the flat board part 92 (coupled driving contacting part 93) is aligned with one end of the surface of the vibrator unit 75 like the lower coupled driving contacting part 93 on the bottom surface shown in FIG. 5F, this can also achieve the same effect.

The piezoelectric sheet layer 87 of the vibrator unit 75 configures a piezoelectric unit for mainly giving a forcible vibration, whereas the elastic sheet layer 89 configures an exciting unit for exciting particular vibration mode along with the piezoelectric unit. However, if desired vibration mode can be excited only with the piezoelectric unit, the exciting unit is not always required.

The piezoelectric sheets 86 forming the piezoelectric sheet layer 87, and the elastic sheets 88 forming the elastic sheet layer 89 are originally, for example, thin rectangular sheet members made of the same material such as PZT (titanic acid lead zirconate), etc. except whether or not an internal electrode process shown in FIG. 5C is executed. Specifically, each of the sheets is, for example, 10 mm (length) by 2.5 mm (width) by 80 μm (height) (thickness in the stacking direction) in size.

As the PZT material used in this embodiment, a hard material having a Qm value as large as 2000 is selected and used. The same material is used also as an elastic sheet. Additionally, the insulation sheets 91 which sandwich the piezoelectric sheet layer 87 and the elastic sheet layer 89 are made of the same PZT material having a thickness of 40 μm. Although these insulation sheets are made of the same material as that of the piezoelectric sheets, electrodes are not provided thereon. Therefore, the insulation sheets are not polarized and have no piezoelectricity, and actually have a characteristic as an insulation material.

The piezoelectric sheets 86 of the piezoelectric sheet layer 87 are configured by two types of sheet-state piezoelectric elements only having different electrode patterns for which the internal electrode process is executed. One of the two types of the piezoelectric sheets 86 is a piezoelectric sheet 86m partitioned into right and left portions, in which A+ internal electrode foil 94 and B− internal electrode foil 95 are formed, on an entire surface as shown in FIG. 5C. For the A+ internal electrode foil 94 and the B− internal electrode foil 95, terminals 94-1 and 95-1, which are intended to make an external connection, are respectively formed to protrude toward one side of the piezoelectric sheet 86m in positions close to both of the right and left ends.

The other type is a piezoelectric sheet 86n similarly partitioned into right and left portions, in which A− internal electrode foil 96 and B+ internal electrode foil 97 are formed, almost on an entire surface. For the A– internal electrode foil 96 and the B+ internal electrode foil 97, terminals 96-1 and 97-1, which are intended to make an external connection, are formed to protrude toward one side, which is the same as the sheet 86m, of the piezoelectric sheet 86n in positions close to the center between the right and the left portions.

For the above described internal electrode foils, silver-palladium alloy or silver is used as their electrode material. The electrode foils are formed to have a thickness of 4 μm, for example, with vapor deposition and a photolithography technique.

In this preferred embodiment, the piezoelectric sheet layer 87 is configured by alternately stacking these two types of piezoelectric sheets 86m and 86n as a total of 48-sheet layers composed of respective 24 sheets.

In this way, in a middle portion except for the topmost and the bottommost portions, the internal electrodes for applying voltages having reverse potentials to both of a piezoelectric sheet 86 (86m or 86n), on which internal electrode foils are formed, and a piezoelectric sheet 86 (86n or 86m), which the internal electrode foils themselves contact.

The terminals 94-1, 95-1, 96-1, and 97-1, which are formed to protrude toward one side of the piezoelectric sheet 86 (86m, 86n) from the above described A+ internal electrode foil 94, A– internal electrode foil 97, B+ internal electrode foil 97, and B– internal electrode foil 95 and are intended to make an external connection, are respectively connected to an A+ electrode connecting external terminal 98, an A– electrode connecting external terminal 99, a B+ electrode connecting external terminal 101, and a B– electrode connecting external terminal 102, which are made of baked silver, on one side surface (one of two side surfaces that are parallel to the two guide shafts 77 shown in FIGS. 4A and 4B and do not face the guide shafts 77) of the vibrator unit 75 shown in FIG. 5A.

The A+ electrode connecting external terminal 98 and the A– electrode connecting external terminal 99 are configured as A phase electrodes, whereas the B+ electrode connecting external terminal 101 and the B– electrode connecting external terminal 102 are configured as B phase electrodes. In this case, the A– electrode connecting external terminal 99 and the B– electrode connecting external terminal 102 are configured for connecting to A phase and B phase grounds (GNDs). Therefore, these terminals may be configured to have the same electric potential by connecting to the same lead wire, etc. in this case.

A voltage is applied from a driving circuit to be described later to the piezoelectric sheet layer 87 via these A phase and B phase electrode connecting external terminals, so that the vibrator unit 75 generates ultrasonic elliptical vibrations to be described later.

The vibrator unit 75 in this preferred embodiment is configured, for example, to be 10 mm (length) by 2 mm (width) by 2.5 mm (height) in size. In this vibrator unit 75, a pin member installment hole 103, which is not shown in FIGS. 4A and 4B, is formed almost in the middle of the A phase and the B phase electrodes, namely, almost in a central part of the vibrator unit 75. The pin member installment hole 103 will be described later.

Additionally, the piezoelectric unit is not limited to the piezoelectric sheet layer 87. For example, the following configuration may be available. FIG. 5D shows the configuration as a piezoelectric unit, where coupled driving contacting parts are attached to a vibrator unit, which is obtained by adhering and linking piezoelectric units 129 composed of stacked layer piezoelectric units or piezoelectric elements, a vibrator unit principal part 130 made of, for example, brass, and vibrator unit components 131. The vibrator unit principal part 130 and the vibrator unit components 131 configure an exciting unit.

FIG. 5E shows a configuration where thin single board piezoelectric units 133 and coupled driving contacting parts 93 are attached to a rectangular-parallelepiped-shaped elastic part 132 made of, for example, brass. The elastic part 132 configures an exciting unit. Attaching these parts by applying sufficient pressure when the parts are attached is vital to increase vibration transmission efficiency.

<Principle of Driving>

Figure 6:
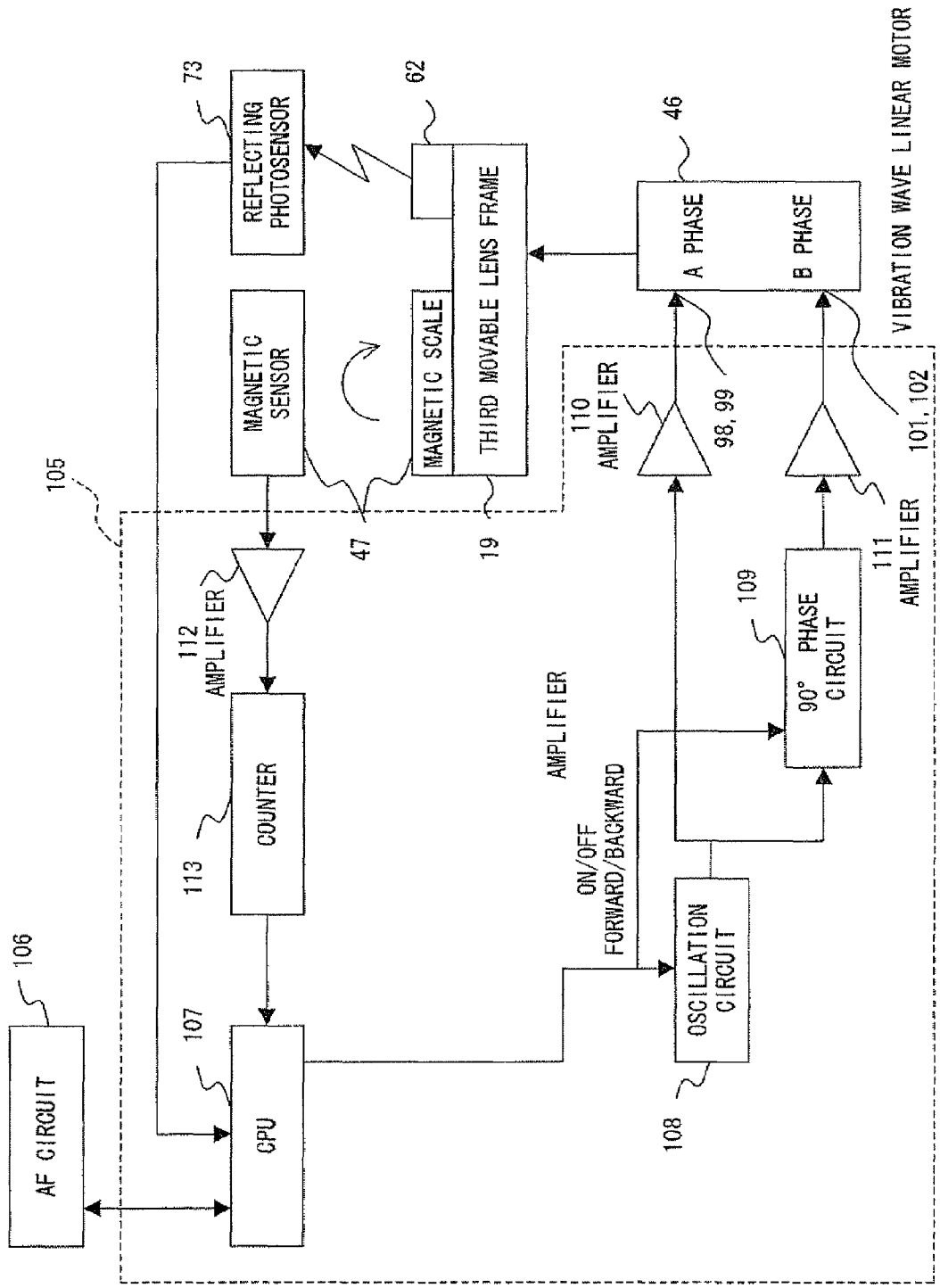
FIG. 6 is a circuit diagram showing a driving circuit driving and controlling the vibration wave linear motor.

FIG. 6 shows a driving circuit driving and controlling a vibration wave linear motor 46 having the above described configuration. The driving circuit 105 shown in this figure is mounted along with an AF (Auto Focus) circuit 106 on the circuit board 2 shown in FIG. 1A.

Upon receipt of any of forward and backward instruction signals along with any of move and stop instruction signals from the AF circuit 106, a CPU (Central Processing Unit) 107 of the driving circuit 105 outputs a corresponding signal to an oscillation circuit 108 and a 90° phase circuit 109.

Upon receipt of the move signal, the oscillation circuit 108 applies an ultrasonic driving voltage to the A phase electrodes 98 and 99 of the vibration wave linear motor 46 via an amplifier 110, and outputs the same ultrasonic driving voltage to the 90° phase circuit 109.

The 90° phase circuit 109 shifts the phase of the frequency of the ultrasonic driving voltage input from the oscillation circuit 108 by +90° or –90° based on the forward or backward instruction signal received along with the move signal from the CPU 107, and applies the voltage to the B phase electrodes 101 and 102 of the vibration wave linear motor 46 via another amplifier 111.

As a result, the vibration wave linear motor 46 self-runs in a predetermined direction as will be described later by making an ultrasonic vibration, and moves the third movable lens frame 19 in a predetermined direction along with the optical axis O2.

As described above, the absolute position of the third movable lens frame 19 is detected in advance by the reflector (light reflecting member 62) and the photosensor 73 of a reflection type. The detected absolute position is notified to the CPU 107.

In the meantime, the move amount of the third movable lens frame 19 is detected in a way such that the magnetic sensor reads the magnetic scale of the magnetic sensor unit 47. A pulse signal, which indicates the move amount read by the magnetic sensor, is output to a counter 113 via an amplifier 112. The counter 113 measures the pulse signal indicating the move amount, and outputs a measurement result to the CPU 107.

The CPU 107 recognizes the current position of the third movable lens frame 19 based on the absolute position of the third movable lens frame 19, which is input from the photosensor 73, and the measurement result of the move amount, which is input from the counter 113, and notifies the AF circuit 106 of the recognized current position of the third movable lens frame 19. The CPU 107 stops the output of the oscillation circuit according to the stop signal from the AF circuit 106.

Figure 7A:
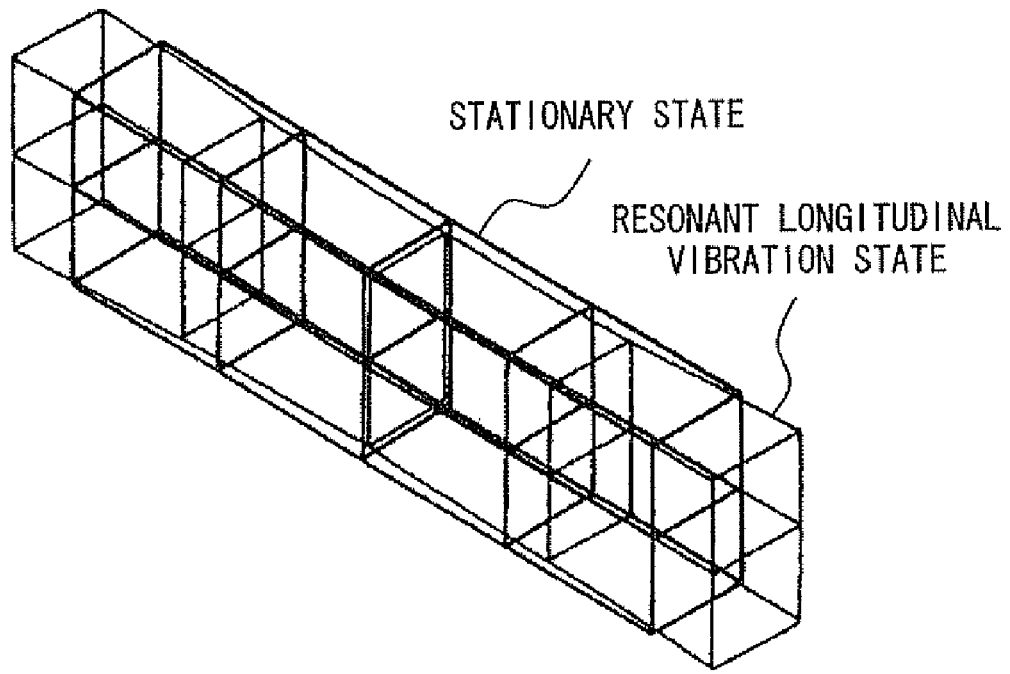
FIGS. 7A and 7B are perspective views schematically explaining ultrasonic elliptical vibrations of the vibrator unit of the vibration wave linear motor.
Figure 7B:
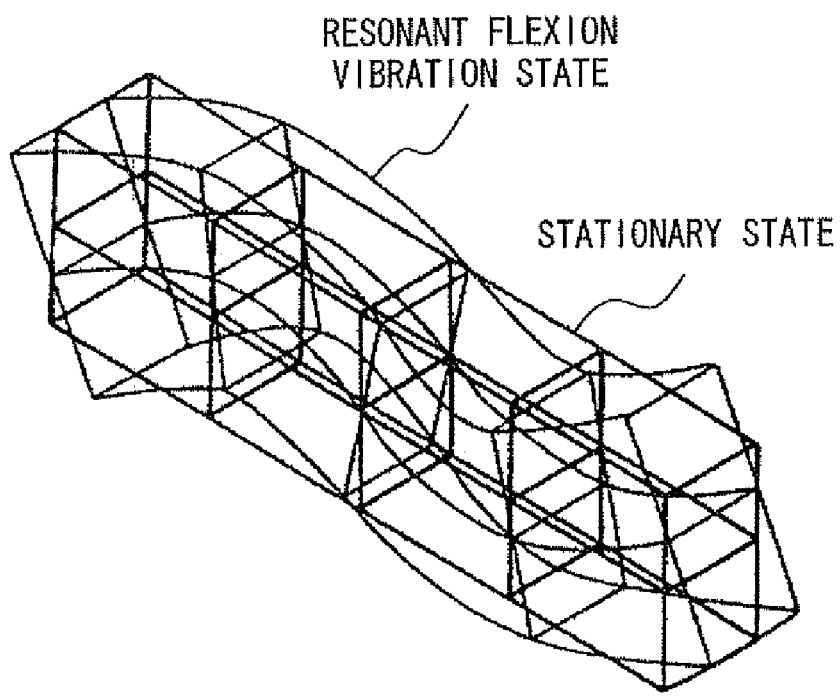

FIGS. 7A and 7B are perspective views schematically explaining ultrasonic elliptical vibrations of the vibrator unit 75 of the vibration wave linear motor 46 that is oscillated and driven as described above.

Firstly, if an alternating current voltage having the same phase in the neighborhood of a frequency 160 kHz is applied to the A phase electrodes 98 and 99 and the B phase electrodes 101 and 102 of the vibrator unit 75 shown in FIG. 5A, a primary longitudinal vibration is excited in the vibrator unit 75. Or, if an alternating current voltage having a reverse phase in the neighborhood of the frequency 160 kHz is applied to the A phase electrodes 98 and 99 and the B phase electrodes 101 and 102, a secondary flexion vibration is excited in the vibrator unit 75.

These vibrations were analyzed with a finite element method by using a computer, so that a resonant longitudinal vibration posture shown in FIG. 7A, and a resonant flexion vibration posture shown in FIG. 7 were respectively expected. Results of the supersonic vibration measurement proved these expectations.

In this preferred embodiment, the resonant frequency of the secondary flexion vibration is designed to be lower than that of the primary longitudinal vibration by several percent (preferably 3 percent or so). With such a configuration, the output characteristic as the vibration wave linear motor can be significantly improved as will be described later.

Next, by applying an alternating current voltage having a phase different by ./2 in the neighborhood of 160 kHz to the A phase electrodes 98 and 99 and the B phase electrodes 101 and 102 of the vibrator unit 75, an elliptical vibration can be observed in the positions of the driving contacting parts 76 of the vibrator 70.

In this case, the direction of the rotation of the elliptical vibration caused by the supersonic vibration in the positions of the driving contacting parts 76 arranged on the bottom surface of the vibrator 70, and that of the rotation of the elliptical vibration caused by the supersonic vibration in the positions of the driving contacting parts 76 arranged on the top surface become reverse.

FIGS. 8A and 8B schematically show the elliptical vibrations of the driving contacting parts of the vibrator when the alternating current voltage having the phase different by ./2 in the neighborhood of 160 kHz is applied. FIG. 8A shows operations performed when the phase of the alternating current voltage, which is applied to the A phase electrodes 98 and 99, is behind by ./2 from the phase of the alternating current voltage, which is applied to the B phase electrodes 101 and 102. In this figure, the driving contacting parts 76 on the bottom surface of the vibrator 70 rotate in a counterclockwise direction, whereas the driving contacting parts 76 on the top surface rotate in a clockwise direction.

FIG. 8B shows operations performed when the phase of the alternating current, which is applied to the A phase electrodes 98 and 99, is ahead by ./2 from the phase of the alternating current voltage applied to the B phase electrodes 101 and 102. In this figure, the driving contacting parts 76 on the bottom surface of the vibrator 70 rotate in the clockwise direction, whereas the driving contacting parts on the top surface rotate in the counterclockwise direction.

As described above, it is preferable that the driving contacting parts on the same surface are arranged in positions where they rotate in the same direction, and the driving contacting parts on the opposite surface are arranged in positions where they rotate in a reverse direction. As a result, driving force can be taken out most efficiently.

Namely, the elliptical vibration into which the longitudinal vibration and the flexion vibration of the vibrator unit 75 are synthesized acts on the two guide shafts 77 via the 4 driving contacting parts, and the vibrator unit 75 and the driving contacting parts 76 self-run between the both of the erecting parts 78-2 of the supporting part 78 along the two guide shafts 77 as one body, so that the linear motor moves forward and backward.

FIGS. 9A, 9B, and 9C explain the move of the entire vibration wave linear motor when the vibrator 75 and the driving contacting parts 76, integrally as one body, self-run and move forward and backward between both of the erecting parts 78-2 of the supporting part 78 along the two guide shafts. FIGS. 9A to 9B show forms where driving contacting parts 76-1 having an arrow arrangement interval contact the movable guide shaft 77-2 unlike FIG. 4 for ease of explanation.

Assume that the vibrator 70 self-runs toward the left of this figure, which is indicated by an arrow d. In FIG. 9A, the elliptical rotation vibration of the driving contacting parts 76 is shown with an arrow in a counterclockwise direction only for the two driving contacting parts 76 on the bottom of the vibrator 70. However, also the two driving contacting parts 76 on the top of the vibrator 70 make an elliptical rotation vibration in the clockwise direction. Driving force generated by these elliptical rotation vibrations exert thrust for the vibrator 70 in the direction of an arrow d.

As described above, in the vibration wave linear motor 46, the elliptical rotation vibrations are generated in the driving contacting parts 76, which kick against the guide shafts 77 with the elliptical rotation vibrations, whereby driving force for moving the vibrator 70 is generated as a counteraction.

Namely, the energy of the elliptical rotation vibrations of the driving contacting parts 76 becomes the energy of the driving. However, the whole of the energy of the elliptical rotation vibrations does not become the energy of the driving. This is because an elastic deformation occurs in the vibrator unit 76 as a result of the counteraction when the driving contacting parts 76 press the guide shafts 77. Namely, a portion of the energy of the elliptical rotation vibrations of the driving contacting parts 76 becomes the driving force of the vibrator 70, and elastically deforms the vibrator unit 76. The amount of the elastic deformation in a case where the driving contacting parts 76 exist at the ends of the vibrator is larger than the amount of the elastic deformation in a case where the driving contacting parts exist close to the center (the center of gravity). Accordingly, in the example shown in FIG. 4, the driving contacting parts 76-1 arranged close to the center (the center of gravity) of the vibrator unit 75 are configured to contact the fixed guide shaft 77-1 in order to efficiently obtain the driving force.

For this reason, the driving contacting parts 76 on the side where the driving contacting parts 76 are arranged at a narrow interval (the side on which the driving contacting parts 76 are arranged close to the center of gravity of the vibrator 70) exert less elastic deformation influence on the vibrator unit 75, whereby the driving force can be generated efficiently.

In the meantime, the guide shaft 77-1 is fixed of the supporting part 78, whereas the guide shaft 77-2 is pressed toward the guide shaft 77-1. Therefore, the guide shaft 77-2 is arranged with a very small gutter in the thrust direction. Accordingly, when the vibrator 70 moves in the direction of the arrow d, the gutter is pulled to make the guide shaft 77-2 abut on the drop preventing pin 84 on the side opposite to the move direction of the vibrator 70 as shown in FIG. 9A.

Accordingly, if the 4 driving contacting parts 76 reverse the directions of the elliptical rotation vibrations in order to reverse the self-running direction as shown in FIG. 9B when the vibrator 70 reaches the leftmost end as shown in FIG. 9A (the 2 driving contacting parts 76 on the top of the vibrator 70 make the elliptical rotation vibration in the counterclockwise direction although only the elliptical rotation vibration in the two driving contacting parts 76 on the bottom of the vibrator 70 is indicated by an arrow in the clockwise direction also in this case in FIG. 9B), the vibrator 70 is driven in the direction of an arrow e shown in FIG. 9C with the driving force generated by the elliptical rotation vibration of the driving contacting parts (two parts on the top in the figure) contacting the guide shaft 77-1 fixed to the supporting part 78.

In the meantime, the driving force generated by the elliptical rotation vibration of the driving contacting parts 76 (the two parts on the bottom in the figure) contacting the movable guide shaft 77-2 for the supporting part 78 is first used to pull the gutter in order to make the guide shaft 77-2 abut on a drop preventing pin 84 on a side opposite to the driving direction 3. Accordingly, if the proceeding direction of the vibrator 70 is changed, the driving force of the driving contacting parts 76 which contact the movable guide shaft 77-2 drives the vibrator 70 after displacing the guide shaft 77-2.

As described above, if the proceeding direction of the vibrator 70 is changed, the vibrator 70 is driven only by the driving force generated by the driving contacting parts 78 which contact the guide shaft 77-1 fixed to the supporting part 78 in the initial stage. Thereafter, upon completion of pulling the gutter for the movable guide shaft 77-2, the vibrator 70 is driven in the direction of the arrow e shown in FIG. 9C also with the driving force generated by the driving contacting parts 76 which contact the guide shaft 77-2.

Thereafter, when the vibrator 70 reverses the self-running direction from the right end toward the left when reaching the rightmost end, the vibrator 70 starts to be driven in the direction of the arrow d shown in FIG. 9A only with the driving force generated by the driving contacting parts 76 which contact the guide shaft 77-1 also in this case. After the reverse move stops when the guide shaft 77-2 becomes the state shown in FIG. 9A, the vibrator 70 starts self-running toward the left as shown in FIG. 9A also with the driving force of the driving contacting parts 76 which contact the guide shaft 77-2. This is the operation principle of the vibration wave linear motor according to the present invention.

In this preferred embodiment, the piezoelectric unit is configured by two portions such as the A phase where the A phase electrodes 98 and 99 are arranged, and the B phase where the B phase electrodes 101 and 102 are arranged. However, the piezoelectric unit is not limited to 2. 3 or more portions may be used as far as they can generate the longitudinal vibration and the flexion vibration.

Additionally, the vibrator 70 is shaped almost like a rectangular parallelepiped. In such a case, the elliptical rotation vibrations are generated with the longitudinal vibration and the flexion vibration, so that the above described driving force is obtained. However, the vibrator may have another shape. Besides, the primary longitudinal vibration and the secondary flexion vibration are used in this embodiment. However, the vibrations are not limited to these vibrations. Higher-order longitudinal and flexion vibrations may be used according to the size of the vibrator, or positions or the number of arranged driving contacting parts.

Furthermore, it is preferable that the driving contacting parts are arranged in arbitrary positions where the output characteristic of the highest level can be obtained as the vibration wave linear motor, namely, positions where the elliptical vibrations of the highest level are generated. More specifically, it is desirable to arrange the driving contacting parts in positions of the trunk of the flexion vibration because the longitudinal vibration and the flexion vibration are generated in the vibrator in this preferred embodiment. Furthermore, as described above, it is preferable to arrange the driving contacting parts in positions close to the center, where less deformation influence is exerted on the vibrator unit, rather than positions at the ends of the vibrator unit, where more deformation influence is exerted on the vibrator unit. Normally, however, since making an elliptical vibration becomes the source of driving, an elliptical vibration occurs in at least one or more driving contacting parts. Therefore, the driving contacting parts may be arranged so that the total sum of driving force caused by a vibration that occurs in the positions of all of the driving contacting parts does not become zero.

Furthermore, it is unnecessary that an elliptical vibration occurs in positions of all of driving contacting parts. Even if a single vibration or a vibration in a reverse direction occurs, it does not matter as far as the total sum of driving force from the driving contacting parts becomes not zero but driving force in one direction.

To maintain the vibrator 70 in a well-balanced manner so as not to generate torque that rotates the vibrator 70 itself, the above described conditions are not always satisfactory. However, for example, only selecting positions where the driving contacting parts 76 generate elliptical vibrations in the same direction on at least either of the top and the bottom surfaces can increase the efficiency.

<Configuration of a Linked Part>

A configuration where forward and backward moving force of the vibrator 70, which is caused by the above described elliptical vibrations, within the vibration wave linear motor 46, is taken out as the move driving force of the third movable lens frame 19 is described next.

FIG. 10A is a perspective view explaining a method linking the above described vibration wave linear motor 46 and the third movable lens frame 19. FIG. 10B is an enlarged perspective view showing only the linked part. FIG. 10C is an enlarged view showing the magnetic sensor unit detecting the move amount of the third movable lens frame 19.

Figure 11A:
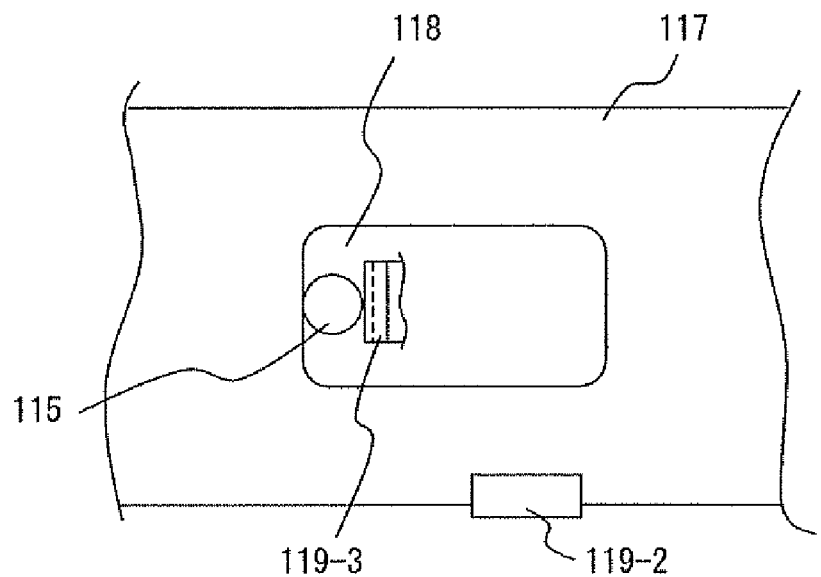
FIG. 11A is a schematic showing FIG. 9B when viewed in the direction of an arrow c.
Figure 11B:
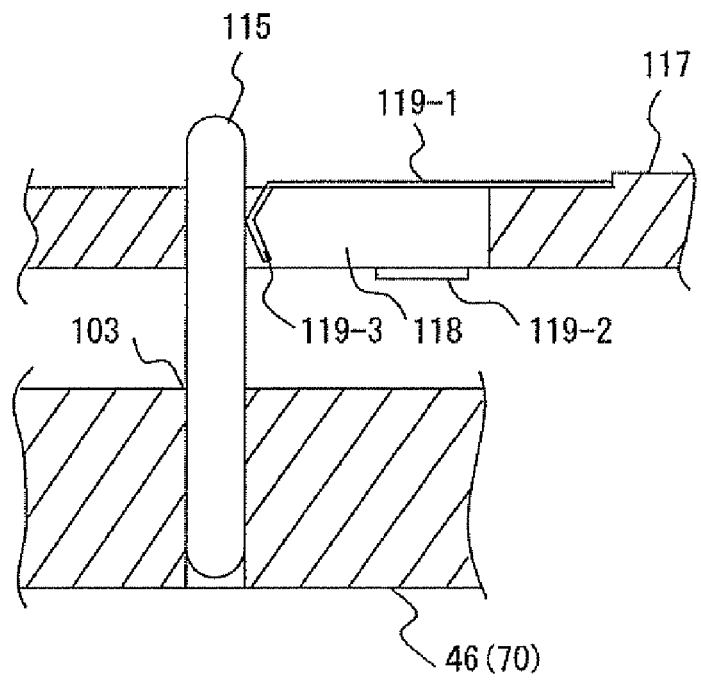
FIG. 11B is a cross-sectional view of FIG. 9B when taken along an arrow line A-A'.

FIG. 11A is a schematic showing FIG. 10B when viewed in a direction of an arrow c. FIG. 11B is a cross-sectional view of FIG. 10B when taken along an arrow line A-A'.

FIG. 10A is a schematic showing the vibration wave linear motor 46 and the third movable lens frame 19 in FIG. 3. Additionally, this figure shows a pin member 115 for taking out a move output, which is fixed by being inserted into the inside from the pin member installment hole 103 shown in FIG. 5A in the center on the surface, where the pin is fixed, at an obliquely upper left on the other side of the vibrator 70, and is pulled out on the side, where the pin is fixed, for ease of understanding.

As shown in FIG. 10A, the third movable lens frame 19 is configured by the lens frame main unit 116 holding the third movable lens unit 12, a shaft bearing part 53-3, and an engaging protruding part 117 provided to protrude downward from the shaft bearing part 53-3. A long hole 118, which extends in a direction parallel with the direction where the lens frame main unit 116 moves along the optical axis O2, is provided almost in a central portion of the engaging protruding part 117.

In the long hole 118 (see also FIGS. 11A and 11B), a board spring 119, which presses the portion (the long hole 118 of the engaging protruding part 117) where the pin member 115 for taking out a move output abuts on the third movable lens frame 19, is engaged from the far side in this figure.

The board spring 119 is configured by a flat main part 119-1, an engaging part 119-2 bent in two stages toward the front and then upward from the bottom of the main part 119-1, and a pressing part 119-3 bent toward the front from the left end of the main part 119-1.

For this board spring 119, its engaging part 119-2 engages with the engaging protruding part 117 by wrapping the bottom of the engaging protruding part 117, where the long hole 118 of the third movable lens frame 19 is formed, from the far side. As a result, the main part 119-1 of the board spring 119 closely contacts with the long hole 118 on the far side, and the pressing part 119-3 is inserted in a predetermined position within the long hole 118 from the far side.

Between the pressing part 119-3 and the left end of the long hole 118, a gap in which the pin member 115 for taking out a move output is inserted is formed.

Between a side surface 116-1 on the opposite side of the lens frame main unit 116 of the third movable lens frame 19 and a surface on the near side of the engaging protruding part 117, a clearance for arranging the driving part including the vibrator 70 of the vibration wave linear motor 46, and its flexible board (to be described later), is formed.

When the vibration wave linear motor 46 is arranged in this clearance, the pin member 115 for taking out a move output is inserted in the gap formed between the pressing part 119-3 and the left end of the long hole 118 as shown in FIG. 10B.

With this engagement, the movements of the pin member 115 for taking out a move output in the direction of the second optical axis O2 are prohibited within the long hole 118, and the pin member 115 faithfully transmits the move of the vibrator 70 of the vibration wave linear motor 46, which is arranged by being fixed to the metal frame 23a not shown in FIG. 10, in the direction of the optical axis O2 to the third movable lens frame 19.

Additionally, for the pin member 115, a play is allowed in its upward and downward movements in the above described engagement. This play absorbs a positional deviation, etc. when the vibrator 70 and the two guide shafts 77 (77-1, 77-2) are installed.

Furthermore, the pin member 115 for taking out a move output accurately transmits the direction and the force of the move of the vibrator 70 in the direction of the second optical axis O2 to the third movable lens frame 19 as described above. In the meantime, the pin member 115 absorbs the upward and downward movements of the vibrator 70, which are caused by the elliptical vibration of the vibrator 70, etc., with the upward and downward movements within the long hole 118, and does not transmit to the third movable lens frame 19.

As described above, as the linkage between the vibrator 70 and the third movable lens frame 19, a linked state implemented with the pin member 115 for taking out a move output, which is fixed to the vibrator 70 and only abuts on the portion (the long hole 118 of the engaging protruding part 117) of the third movable lens frame 19 with the pressing force of the board spring 119, is formed. As a result, the moving force (driving force) of the vibrator 70 is transmitted to the move of the third movable lens frame 19.

As described above, the pin member 115 is a move driving transmitting means for transmitting the move driving force of the vibrator 70 to an outside (a move driving mechanism within an electronic appliance, a member to be driven to move within a device) when the vibration wave linear motor 46 is comprised in the electronic appliance, device, etc.

Additionally, in this preferred embodiment, the pin member 115 for externally taking out the moving force of the vibrator 70 (driving force of the driving contacting parts 76) is arranged by being fixed to the central part of the vibrator 70, namely, a section common to the primary longitudinal vibration and the secondary flexion vibration (neighborhood of a stationary point in each of the vibration modes). Even if another vibration mode or a synthesis of vibration modes is used as the vibration mode of the vibrator, the pin member 115 is arranged in a section common to the vibration modes, or a portion where the vibration becomes minimal, whereby the moving force of the vibrator can be transmitted to a member to be moved without impeding the vibration of the vibrator.

In the meantime, in the vibration wave linear motor 46 in this preferred embodiment shown in FIG. 4B, the vibrator 70 and the two guide shafts 77 were described to have a relationship of a relative move. If this relative move is described with reference to FIG. 10, the vibrator 70 which self-runs with reference to the fixed supporting part 78 moves the third movable lens frame 19 linked to the vibrator 70 in the case of FIG. 10. Assume a configuration where both of the ends of the vibrator 70 in the move direction are sandwiched by an elastic member which does not prevent the vibration of the vibrator 70, this elastic member is fixed to the metal frame 23a, and a supporting part supporting the two guide shafts 77 is formed in a suitable position of the third movable lens frame 19.

With such a configuration, the vibrator 70 is arranged by being fixed, and the two guide shafts 77 which are driven by the driving contacting parts 76 of the vibrator 70 are moved. Namely, the third movable lens frame 19 linked to the two guide shafts 77 moves.

Such a configuration can be also implemented. Accordingly, the description that the vibrator 70 and the two guide shafts 77 have a relationship of a relative move was provided. However, the following description sometimes states that the vibrator 70 self-runs along the two guide shafts 77 based on the configuration shown in FIG. 10.

In the linked configuration shown in FIG. 10, one end, which is not shown by being hidden, of the magnetic scale 121 of the magnetic sensor unit 47 is arranged by being fixed to the engaging protruding part 117, and the magnetic sensor 122 of the magnetic sensor unit 47 is arranged by being fixed to the metal frame 23a, which is not shown in FIG. 10, in a position as opposed to the other end, which is shown, of the magnetic scale 121.

The magnetic sensor 122 is arranged by being fixed to the metal frame 23a in a way such that the magnetic sensor 122 is fit into the sensor holding frame 123, and a fixing board 124 fixing the sensor holding frame 123 is fixed to the metal frame 23a with a fixing hole 124-1. Additionally, a board spring member 125 pressing the magnetic scale 121 in the direction of the magnetic sensor 122 is simultaneously arranged by being fixed. Additionally, a board spring member 125, which presses the magnetic scale 121 in the direction of the magnetic sensor 122, is simultaneously arranged by being fixed.

<Detection of the Amount of Move>

Figure 12:
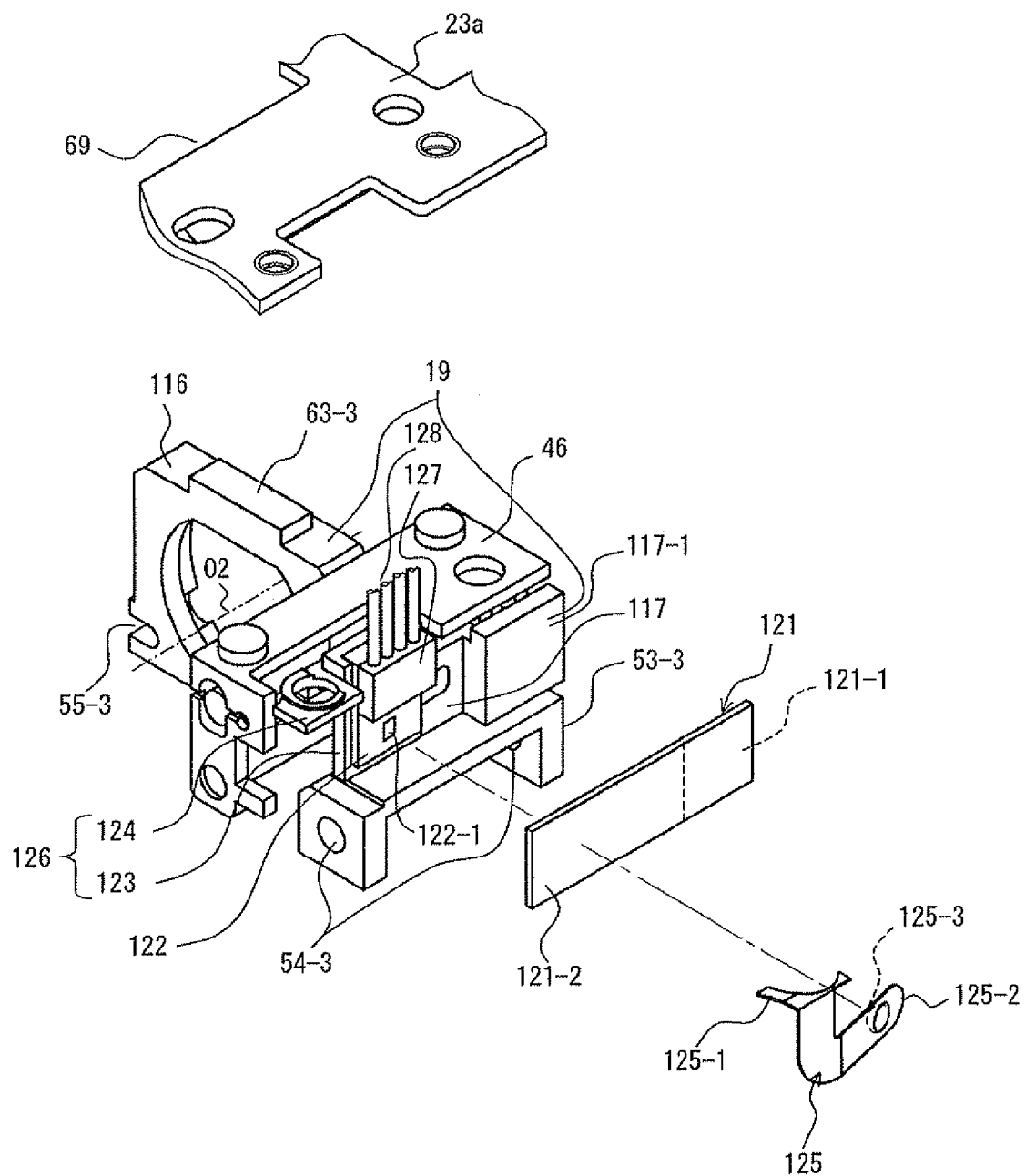
FIG. 12 is a partial disassembly perspective view showing the detailed configuration of the magnetic sensor unit along with the vibration wave linear motor where the magnetic sensor unit is assembled, and the third movable lens frame.

FIG. 12 is a perspective view showing a partial disassembly of the detailed configuration of the magnetic sensor unit 47 shown in FIGS. 2 and 3 along with the vibration wave linear motor 46 in which the magnetic sensor unit 47 is assembled, and the third movable lens frame 19.

The magnetic sensor unit 47 is arranged to detect the move distance of the third movable lens frame 19 from an absolute position after the photosensor 73 shown in FIG. 2 detects the absolute position of the third movable lens frame 19.

As shown in FIG. 12, the above described vibration wave linear motor 46 is arranged between the side surface (the side surface opposite to the side surface on which the U-shaped cut part 55-3 exists) of the lens frame main unit 116 of the third movable lens frame 19 and the engaging protruding part 117 as described with reference to FIG. 10. This vibration wave linear motor 46 is fixed to the metal frame 23a along with the magnetic sensor holder 126 (the sensor holding frame 123 and the fixing board 124).

The fixing board 124 of the magnetic sensor holder 126 is configured to engage with an engaging part 125-1 of the board spring 125, and the sensor holding frame 123 of the magnetic sensor holder 126 holds the magnetic sensor 122.

A detecting unit 122-1 for detecting magnetism is formed almost in the central part of the magnetic sensor 122. Additionally, 4 electrode lead wires 128 whose electric connections to the magnetic sensor 122 are reinforced with an adhesive 127 are drawn from the top of the detecting unit 122-1.

Additionally, an engaging part 121-1 of the magnetic scale 121 is attached to a scale holding part 117-1 which forms a flat part by extending outside (obliquely lower right direction in FIG. 12) with a predetermined step height from the engaging protruding part 117 which erects (which erects under the shaft bearing part 53-5 because it is viewed upside down in FIGS. 3 and 10) above the shaft bearing part 53-5 of the third movable lens frame. With this configuration, the magnetic scale 121 is fixed to the scale holding part 117-1 by orientating its scale surface toward the detecting unit 122-1 of the magnetic sensor 122.

This magnetic scale 121 is installed by being fixed to the third movable lens frame 19 via the scale holding part 117-1, whereas the magnetic sensor 122 is fixed to the metal frame 23a. Additionally, the third movable lens frame 19 is arranged to be movable along the two guide shafts (65, 68) against the metal frame 23a as described above, whereby also the magnetic sensor 122 and the magnetic scale 121 are arranged to be relatively movable.

This magnetic scale 121 is made of an elastic sheet material, for example, a resinous sheet such as polyester, etc., and obtained by coating a magnetic material on the scale surface side, and by magnetizing the magnetic material at predetermined intervals. To make the magnetic sensor 122 read the magnetism, it is preferable that the scale surface of the magnetic scale 121 and the detecting unit 122-1 of the magnetic sensor 122 are as close as possible at all times.

Accordingly, a board spring 125 is provided. Namely, the board spring 125 comprises a spring part 125-2 which extends downward from an engaging part 125-1 and further extends horizontally in the form of a hook. At the end of the spring part 125-2, a dome-shaped convex part 125-3 which is provided to protrude toward the side of the magnetic scale 121 is formed. This convex part 125-3 is formed in a position corresponding to the detecting unit 122-1 of the magnetic sensor 122.

The engaging part 125-1 of the board spring 125 is fixed to the metal frame 23a along with the fixing board 124 of the magnetic sensor holder 126, whereby the convex part 125-3 of the board spring 125 presses a portion, namely, a free end side 121-2, which is not fixed to the engaging part 117-1 of the magnetic scale 121, against the detecting unit 122-1 of the magnetic sensor 122.

As a result, the scale surface of the magnetic scale 121 makes a relative move while sliding and contacting the detecting unit 122-1 of the magnetic sensor 122. The scale surface of the magnetic scale 121 slides and contacts the detecting unit 122-1 of the magnetic sensor 122 in this way, whereby the magnetic sensor 122 can properly read the scale of the magnetic scale 121.

As described above, the portion of the board spring 125, which presses the back side of the scale surface of the magnetic scale 121, is formed by the dome-shaped convex part 125-3. Therefore, frictional resistance with the magnetic scale 121 is extremely small, thereby reducing resistance load generated by the pressing.

Additionally, it is preferable to paste non-magnetic metal foil having a smooth surface, or to form a smooth resinous layer on the back side of the magnetic scale 121. This can suppress the abrasion caused by the friction with the board spring 125 to be low, and the lifetime of the apparatus can be maintained for a long time.

As described above, in this preferred embodiment, the vibration wave linear motor caused by driving a vibration wave has a simple configuration where a plurality of driving contacting parts are provided on two opposed surfaces of the ultrasonic vibrator shaped like a rectangular parallelepiped, and both of the surfaces on which the driving contacting parts are arranged are supported by guide shafts. This allows the ultrasonic vibrator, which does not require a dedicated rotation stopper, to self-run, conventionally required movable rail, table linked to the movable rail, etc. become unnecessary, and also an arrangement space of the respective units in the configuration becomes extremely small.

Accordingly, for example, if the linear motor is embedded in a main body apparatus such as a lens apparatus, etc., a small arrangement space such as a narrow clearance between the housing of the main body apparatus and a lens frame to be driven is sufficient. As a result, the vibration wave linear motor that is reduced in size with such a simple configuration can be provided.

Furthermore, a plurality of driving contacting parts are arranged in the vibrator, and made to slide along the guide shafts with optimum pressing force. As a result, driving force generated by the vibration wave elliptical vibrations of the ultrasonic vibrator can be sufficiently delivered, and the running of the vibrator can be stabilized. As a result, the operation performance as a vibration wave linear motor can be improved.

The above described preferred embodiment adopts the configuration where the guide shafts are fixed, and the vibrator move along the guide shafts. Inversely, however, the vibrator may be fixed, and the guide shafts may be moved as members to be driven. In either case, it goes without saying that the configuration where the guide shafts and the vibrator make a relative move remains unchanged.

<Flexible Board>

A flexible board arranged between the external electrodes of the vibrator 70 of the vibration wave linear motor 46 and the driving circuit 105 is described next.

FIG. 13 is a perspective view showing the above described vibration wave linear motor 46, and the flexible board arranged between the external electrodes of the vibrator 70 of the vibration wave linear motor 46 and the driving circuit 105.

As described above (see FIG. 5A), the 4 electrode connecting external terminals (A+ electrode connecting external terminal 98, the A− electrode connecting external terminal 99, the B+ electrode connecting external terminal 101, and the B− electrode connecting external terminal 102) of the A phase and the B phase, which are arranged in the vibrator 70 and made of baked silver, are connected to the terminals for an external connection within the respective electrode foils, on the side of the vibrator, where these terminals are provided to protrude.

Namely, the above described 4 A phase and B phase electrode connecting external terminals are arranged on one side of the two side surfaces (where the guide shafts 77 are not arranged) which do not face the guide shafts 77 in the direction (namely, the self-running direction of the vibrator 70) of the two guide shafts 77 of the vibrator 75. An electrode connecting part 130-1 of the flexible board 130 is arranged by being electrically connected to the 4 electrode connecting external terminals arranged only on one side surface.

For the flexible board 130, a wiring part 130-2 is separated into two portions in the forward and backward directions of the self-running direction of the vibrator 70 from an end (the electrode connecting part 130-1) connected to the electrodes (the 4 A phase and B phase electrode connecting external terminals). Additionally, wiring parts 130-2, which are separated as two branches, are formed to be identical in width.

In this vibration wave linear motor 46, both of the ends of the two guide shafts 77 (77-1, 77-2) are respectively held by the erecting parts 78-2 existing at both of the ends of the supporting part 78. However, the wiring parts 130-2, which are separated as two branches, of the flexible board 130 are curved toward the central portion in the neighborhoods of both of the ends of the supporting part 78, namely, the two erecting parts 78-2, and merge in the central portion.

Additionally, at one end (both of the ends in this example) of at least one of the two erecting parts 78-2, which are the ends of the supporting part 78, an open part 78-3, which allows the curving wiring parts 130-2 of the flexible board 130 to enter and exit when the parts curve and move with the self-running of the vibrator 70, are provided.

Furthermore, in the vibrator unit 75 of the vibration wave linear motor 46, the pin member installment hole 103 is formed in a position in the neighborhood of the above described A phase and B phase electrodes as shown in FIG. 5A. With the pin member installment hole 103, the pin member 115 for linking to the engaging protruding part 117 of the third movable lens frame 19 is provided to protrude in a direction orthogonal to the self-running direction of the vibrator 70. The above described flexible board 130 comprises an unimpeding hole 13-3, which does not impede the protrusion of the pin member 115, in the electrode connecting part 130-1.

As described above, for the flexible board 130 in this preferred embodiment, the electrode connecting external terminals to be connected of the vibration unit 75 are arranged on only one of the two side surfaces of the vibrator unit 75, whereby the wiring of the flexible board 130 to the driving circuit 105 can be concentrated in one portion. As a result, a reduction in the size of the entire apparatus can be improved.

Furthermore, the flexible board 130, which is extended from the electrode connecting end part to the driving circuit 105, is arranged by being separated into two branches in the forward and backward directions of the self-running direction of the vibrator 70. As a result, the widths of the wiring parts 130-2 can be made narrow because of the separation as two branches. Therefore, the width of the extended portion of the flexible board 130 can be made narrow, and at the same time, the branched wiring parts 130-2 are formed to be identical in width, whereby the spaces of the flexible board 130 (namely, the wiring parts 130-2) where the wiring parts are arranged by being extended can be made identical in width. As a result, the vibration wave linear motor 46 can be further reduced in size, and the periphery of the flexible board can be designed with ease.

Furthermore, the open parts 78-3 in/from which the curving wiring parts 130-2 of the flexible board 130 enter/exit, are provided in the erecting parts 78-2 of the supporting part 78. Therefore, the space where the flexible board 130 is accommodated when the curving wiring parts 78-3 curve and move with the self-running of the vibrator 70 is enlarged, whereby the load of curving fluctuations of the curving wiring parts 130-2 of the flexible board 130 with the self-running of the vibrator 70 is reduced, leading to the facilitation of the self-running of the vibrator 70.

Furthermore, the preventing hole 13-3, which does not impede the protrusion of the pin member 115, is comprised, in the electrode connecting part 130-1 of the flexible board 130, whereby the flexible board 130 can be arranged between the third movable lens frame linked by the pin member 115 and the vibrator 70, and a size reduction in a main body apparatus such as the lens apparatus 1, etc., in which the vibration wave linear motor 46 is embedded, is promoted.

Still further, if the small vibration wave linear motor comprising the self-running vibrator is comprised as the driving source of a lens frame for achieving a focus as described above, the lens apparatus that calmly makes lens driving can be provided.

Besides, in this case, the curving wiring parts of the flexible board of the vibration wave linear motor are arranged between the vibrator and the lens frame linked to the vibration wave linear motor and driven as described above, whereby the lens apparatus further reduced in size can be provided.

<Driving Contacting Parts and Guide Shafts>

For the self-running of the vibrator 70 of the above described vibration wave linear motor 46, a relationship between the driving contacting parts 76 and the guide shafts 77 is essential.

Figures 14A, 14B:
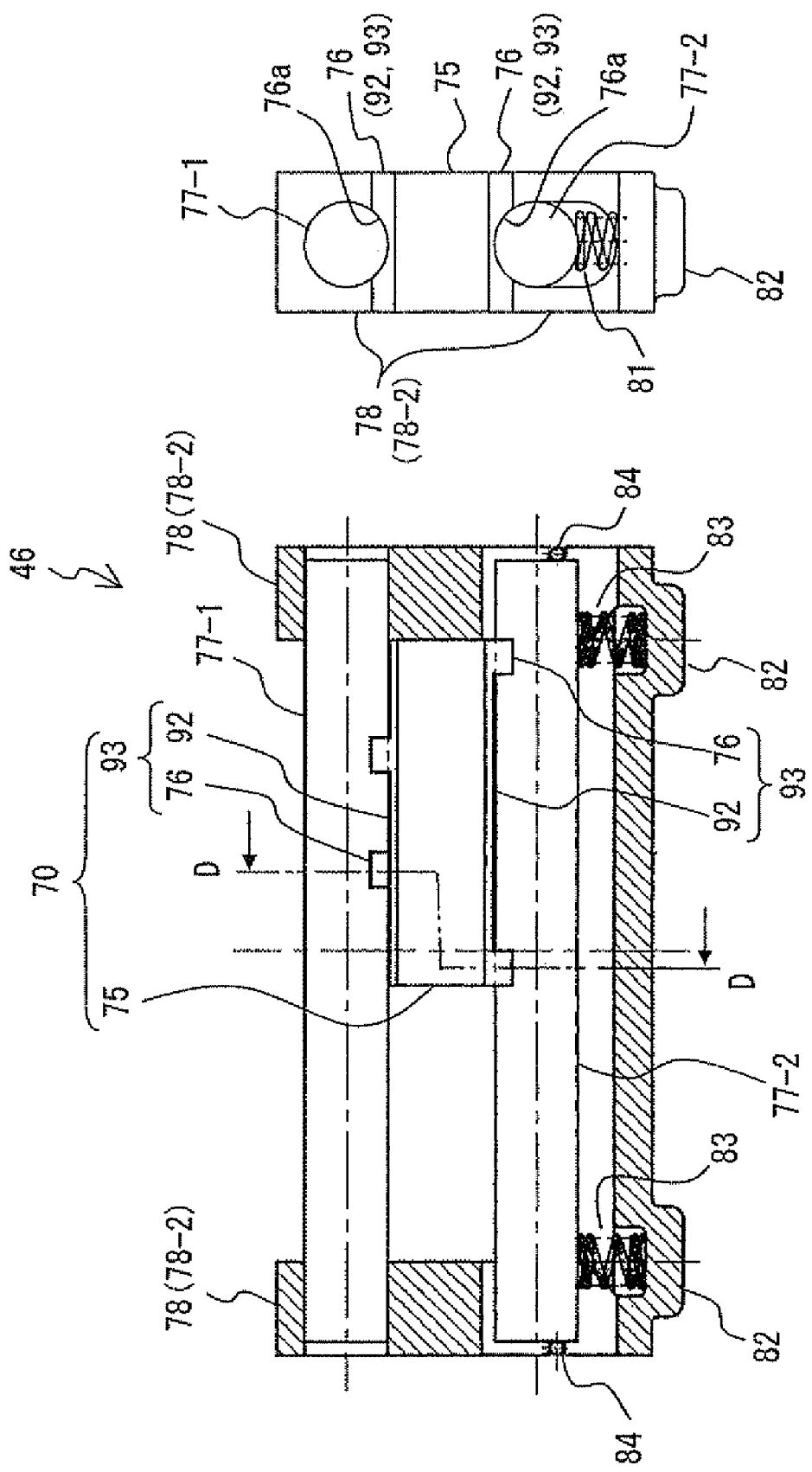
FIGS. 14A and 14B are schematics showing basic forms of driving contacting parts and the guide shafts.

FIGS. 14A and 14B show a basic form of the engagement of the driving contacting parts 76 and the guide shafts 77. FIG. 14A is a cross-sectional view of FIG. 13 when taken along an arrow line C-C', whereas FIG. 14B is a cross-sectional view of FIG. 14A when taken along an arrow line D-D'. In the vibration wave linear motor 46 shown in FIGS. 14A and 14B, the flexible board 130, and the open parts 78-3 of the erecting parts 78-2 of the supporting part 78, which are shown in FIG. 13, are omitted.

In FIGS. 14A and 14B, the same constituent elements as those shown in FIGS. 4A, 4B, 5A, 10A, and 13 are denoted with the same reference numerals. As shown in FIG. 14B, as the form of the contact engagement of the driving contacting parts 76 and the upper and lower guide shafts (77-1, 77-2), the round-bar-state guide shafts 77, and the driving contacting parts 76 whose concave cut parts 76a are shaped like an arc along the outer surface of the guide shafts 77 are basically used, and the engagement form of the driving contacting parts 76 and the round-bar-state guide shafts 77, which are basically used, is used as the basic form.

FIG. 15A also shows the basic form of the contact engagement of the driving contacting part 76 and the guide shaft 77, which is shown in FIG. 14B. FIGS. 15B to 15E respectively show its modification examples. As shown in FIG. 15A, the driving contacting part 76 makes an elliptical rotation vibration in the vibration direction f on the cross section vertical to the proceeding direction of the vibrator 70. Accordingly, if the driving contacting part 78 and the guide shaft 77 are arranged to contact each other in order to make a contact surface M, which is formed by including the contact portion of the driving contacting parts 76 and the guide shafts 77, and the vibration direction f vertical, the driving force is generated efficiently.

In other words, the driving force can be generated more efficiently as the angle formed by the normal H of the contact surface M and the vibration direction f becomes smaller. In the example shown in FIG. 15A, the driving contacting part 76 and the guide shaft 77 contact not only on the arc surface but also on the contact surface M orthogonal to the vibration direction f, whereby the driving force can be generated efficiently.

In the modification example shown in FIG. 15B, the guide shaft 77 having a circle cross section, and the cut part 76 having an arc cross section contact (abut on or contact by being pressed) at a point 131 (one point because this figure is a cross section. Actually, one line) on the bottom (a surface as opposed to the open portion of the groove is referred to as the bottom here although the surface is the top in this figure), and the direction of the normal H on the contact surface M in the contact portion (the point 131) matches the vibration direction f of the driving contacting part 76-3. Accordingly, the driving force can be generated efficiently also according to the example shown in FIG. 15B.

In the modification example shown in FIG. 15C, the guide shaft 77 having a circular cross section, and the cut part 76a having a square-bracket-shaped cross section contact at a point 131 on the bottom of the groove formed by the cut part 76a, and the direction of the normal H on the contact surface M in the contact portion (the point 131) matches the direction where the driving force of the driving contacting part 76-3 exerts. Therefore, the driving force can be generated efficiently also according to the example shown in FIG. 15C.

Furthermore, in the modification examples shown in FIGS. 15D and 15E, a modified guide shaft 77-3 having a cross section other than a circle, and a trapezoidal cut part 76a contact in a line 132 (the line because this figure is the cross-sectional view. Actually, the surface) in a predetermined range of the bottom of the groove formed by the cut part 76a, and the direction of the normal H on the contact surface M in the contact portion (the line 132) matches the vibration direction f of the driving contacting part 76-3.

As described above, in the forms of the contact engagement of the driving contacting part 76-3 of a one-portion contacting type and the guide shaft (the round-bar shaped guide shaft 77 or the modified guide shaft 77-3, which are shown in FIGS. 15B and 15E, the direction of the normal H on the contact surface M in the contact portion matches the direction where the driving force of the driving contacting part 76-3 exerts, whereby these forms are functional forms where the driving force of the driving contacting part 76-3 exerts at a maximum, and it can be said that the driving contacting part 76-3 having such shapes is a driving contacting part having a powerful driving function.

However, in these forms of contact engagement, a contact portion is one point or a predetermined range on the bottom of the groove formed by the cut part 76a. Accordingly, only an upper portion of the cut part 76a contacts the guide shaft 77 (or 77-3. The same applies hereinafter).

In other words, the width of the bottom of the groove formed by the cut part 76a is wider than that of the contact point or surface of the guide shaft 77 inserted in this groove, and the width of the open portion is formed to be wider than the width of the above described bottom, and the maximum width of the guide shaft 77 inserted in this groove.

As a result, a gap which allows a play is formed between the both of the sides of the guide shafts 77 and both of the side walls of the groove formed by the cut part 76a. This is because the driving contacting parts 76 and the guide shafts 77 are made to contact to make the vibration direction f and the direction of the normal H on the contact surface M parallel. Namely, the gap is formed between both of the side walls of the groove formed by the cut part 76a and both of the sides of the guide shafts 77, whereby the aimed contact state can be implemented even if a manufacturing error or an assembly error exists in the curt part 76a and the guide shaft 77.

Accordingly, the driving contacting part 76-3 having the shapes shown in FIGS. 15B to 15E is a driving contacting part having a powerful driving function. However, a predetermined play is allowed for the guide function for the vibrator unit 75 (see FIGS. 14A and 14B) installed via an installment surface 76b from the guide shaft 77, namely, the guide function controlling the move of the vibrator 70 in the relative move direction, and a direction orthogonal to the arrangement direction of the two upper and lower guide shafts 77, namely, a direction deviating from the relative move direction.

FIG. 16A also shows the contact engagement, which is shown in FIG. 14B, of the driving contacting part 76 and the guide shaft 77. FIGS. 16B to 16F respectively show modification examples different from the above described ones. In the basic form shown in FIG. 16A, the relationship between the vibration direction f of the elliptical rotation vibration of the driving contacting part 76 and the normal H on the contact surface M on which the driving contacting part 76 and the guide shaft 77 contact is as described above.

The cross section of the cut part 76a shown in FIG. 16B is shaped like an arc. The cross section of the cut part 76a shown in FIG. 16C is V-shaped. The cross section of the cut part 76a shown in FIGS. 16D and 16E is shaped like a trapezoid. The cross section of the cut part 76a shown in FIG. 16F is shaped like an inverted cup having squares. Additionally, the cross section of the guide shaft 77 shown in FIGS. 16A, 16B, and 16C is shaped like a circle. The cross section of the modified guide shaft 73 shown in FIG. 16E or 16F is shaped like a hexagon or a square.

In the forms of the contact engagement of the driving contacting part 76-4 and the guide shaft 77 (or 77-3. The same applies hereinafter), the guide shaft 77 contacts not on the bottom of the groove formed by the cut part 76a but at each point 133 (actually a line) or each line 134 (actually a surface) on both of side walls of the groove. Namely, the driving contacting part 76-4 and the guide shaft 77 contact in two portions on both of the side walls except for the bottom of the groove.

As described above, the driving contacting part 76-4 of a two-portion contacting type contacts the guide shaft 77 in the two portions on both of the side walls of the groove formed by the cut part 76a, so that a play does not exist between both of the side surfaces of the guide shaft 77 and both of the side walls of the groove formed by the cut part 76a. Accordingly, the guide function for the vibrator unit 75 (see FIGS. 14A and 14B) installed via the installment surface 76b from the guide shaft 77, namely, the guide function, which controls the move of the vibrator 70 in the relative move direction of the vibrator 70 with reference to the guide shaft 77, and a direction orthogonal to the direction where the 2 upper and lower guide shafts 77 are arranged, namely, a direction deviating from the relative move direction, completely and powerfully operates. As a result, it can be said that the driving contacting part 76-4 having the shapes shown in FIGS. 16B to 16F shown in FIGS. 16B to 16F is a driving contacting part having a powerful guide function. Additionally, since the driving contacting part and the guide shafts 77 contact in two portions, it can be also said that this form is a form having high durability.

However, an angle θ formed by the normal H on the contact surface M in the two contact portions and the vibration direction f of the driving contacting part 76-4 becomes large in comparison with the examples shown in FIGS. 15A to 15E. Since the vibration direction f and the contact surface M are not perpendicular, pressing force, which exerts in a direction perpendicular to the installment surface 76b of the driving contacting part 76-4, within the pressing force, which is generated upwardly as a result of the elliptical rotation vibration of the driving contacting part 76-4 and presses the guide shaft 77, can become the driving force of the vibrator 70. Accordingly, it can be said that the driving force of the driving contacting part 76-4 in this form is weaker than the driving contacting part 76-3 shown in FIGS. 15B to 15E for this reason.

In the meantime, the guide shaft 77-2 among the upper and the lower two guide shafts 77 is held to freely move up and down by the shaft bearing long holes 81 and the spiral springs 83. Therefore, especially when the vibrator 70 exists in the neighborhoods of both of the ends, the 2 upper and lower guide shafts 77 are not parallel (their separation on the side where the vibrator 70 does not exist becomes somewhat shorter), so that some of the driving contacting parts 76 does not contact the guide shafts 77 in some cases.

Adding some mechanism for holding parallelism can resolve such a phenomenon. However, the phenomenon that any of the driving contacting parts 76 is apart from the guide shafts 77 is not an essential problem for the driving.

Figure 17A:
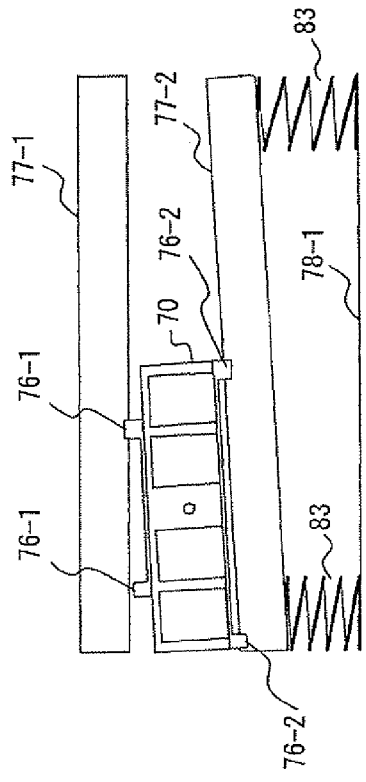
FIG. 17A to 17D explain that an essential problem does not occur in driving even if any of driving contacting parts is apart from guide shafts.
Figure 17C:
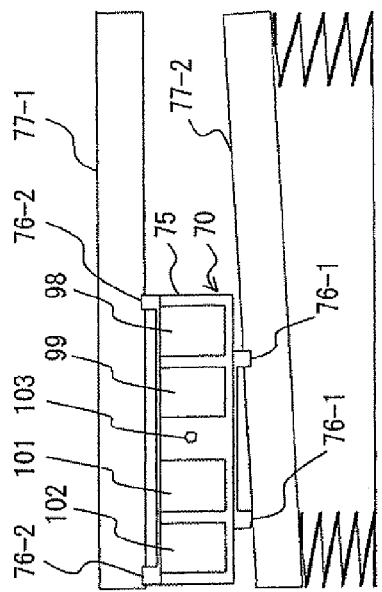
Figure 17B:
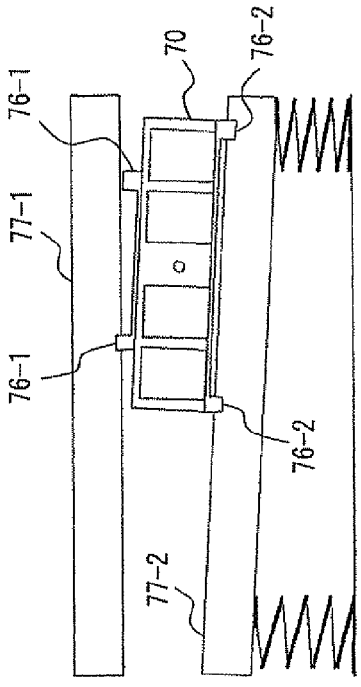

FIGS. 17A to 17D are schematics explaining that no essential problem occurs in the driving even if any of the driving contacting parts 76 is apart from the guide shafts 77. FIGS. 17A and 17B show basic forms of the driving parts of the vibration wave linear motor 46, which is shown in FIG. 4B. These figures show the vibrator 70, the two guide shafts 77 (77-1, 77-2) sandwiching the vibrator, 2 spiral springs 83 pressing the lower guide shaft 77-2 upward at both of the ends of the guide shaft 77-2, and a base part 78-1 of the supporting part 78 holding these guide shafts 77 and the spiral springs 83.

Additionally, in the vibrator 70, the two driving contacting parts 76-1 arranged at a narrow interval, the 2 driving contacting parts 76-2 arranged at a wide interval, the pin member installment hole 103 in the center, and the A+ electrode connecting external terminal 98, the A− electrode connecting external terminal 99, the B+ electrode connecting external terminal 101, and the B− electrode connecting external terminal 102, which exist on both sides of the pin member installment hole 103, are shown.

The number of the above described driving contacting parts 76-1 arranged at the narrow interval are not limited to 2, and may be 1.

An arrangement configuration of the vibrator 70, the driving contacting parts 76, and the guide shafts 77 in such a configuration are further described with reference to FIGS. 17A and 17B. The supporting part 78, the upper guide shaft 77-1 fixed to the supporting part 78, the lower guide shaft 77-2 arranged to be movable toward the upper guide shaft 77-1, the spiral springs 83 pressing the lower guide shaft 77-2 toward the upper guide shaft 77-1, the vibrator 70, which is arranged between the upper and the lower guide shafts 77, vibrating by being applied with a driving signal, and making a relative move in a predetermined relative move direction with reference to the upper guide shaft 77-1, the two driving contacting parts 76-2 arranged at a predetermined interval on the side of the vibrator, which faces the upper guide shaft 77-1 of the vibrator 70 in the relative move direction, one driving contacting part 76-1 arranged in a position corresponding to in between the two driving contacting parts 76-2 on the side of the vibrator 70, which faces the lower guide shaft 77-2, are comprised. One more driving contacting parts 76-1 are arranged on the side facing the lower guide shaft 77-2 so that the arrangement interval of the two driving contacting parts 76-2 is narrower than that of the above described 2 driving contacting parts. It can be said that also the driving contacting part added later to the side facing the lower guide shaft 77-2 is arranged in a position corresponding to in between the two driving contacting parts 76-2.

In the meantime, the phenomenon that any of the driving contacting parts 76 is apart from the guide shafts 77 is not an essential problem for the driving, as stated earlier. For example, in the above described FIGS. 17A and 17B, all of the 4 driving contacting parts 76 contact the guide shafts 77 in the neighborhood of the center of the move path. However, the lower left and the lower right driving contacting parts 76 somewhat float respectively at the left and the right ends in some cases.

In this case, the driving contacting part 76 (the lower right part when the floating part is at the left end), which does not float, contacts the guide shaft 77-2 and makes an elliptical vibration, and becomes the source of the driving force. The driving contacting parts 76 are members or portions forming contact portions. Precisely, however, the driving contacting parts 76 must be considered as portions that contact the guide shafts 77 on at least a portion of the move path.

Figure 17D:
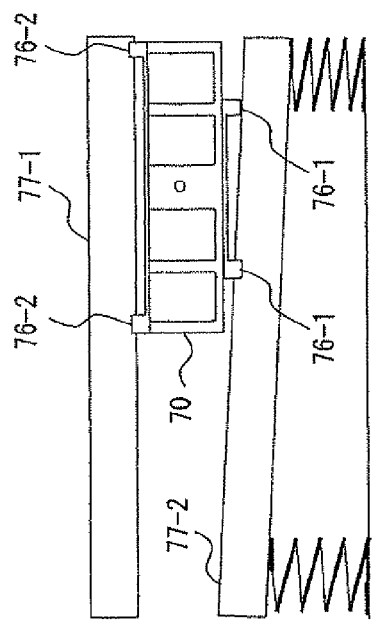

FIGS. 17C and 17D exemplify the cases where the vibrator 70 is arranged upside down from the cases shown in FIGS. 17A and 17B. Namely, the driving contacting parts 76-2 having a wide arrangement interval are arranged to contact the movable guide shaft 77-2, whereas the driving contacting parts 76-1 having a narrow arrangement interval are arranged to contact the fixed guide shaft 77-1. Details of the arrangement configurations of the vibrator 70, the driving contacting parts 76, and the guide shafts 77 are omitted because the description is redundant if it is provided. However, the arrangement configurations can be described in compliance with the cases shown in FIGS. 17A and 17B.

In the meantime, FIGS. 15 and 16 show the various different forms of the contact engagement of the driving contacting parts 76 and the guide shafts 77. Which of the forms of the contact engagement shown in FIGS. 15 and 16 must be selected as which of the arrangements of the vibrator 70, the driving contacting parts 76, and the guide shafts 77, which are shown in FIGS. 17R to 17D, in consideration of the running characteristics of the vibrator 70 in the move direction.

FIGS. 18 to 23 are schematics explaining forms of the contact engagement of the driving contacting parts and the guide shafts, and the running characteristics of the vibrator in the arrangement configurations of the vibrator 70, the driving contacting parts, and the guide shafts.

Additionally, each of FIGS. 18 to 21 schematically shows a configuration, similar to FIG. 14A, where the interval of the 2 upper driving contacting parts have a narrow interval, and that of the 2 lower driving contacting parts have a wide interval on the right side, and also schematically shows a cross-sectional view, similar to FIG. 14B, on the left side. Furthermore, FIGS. 22A, 22B, 23A, and 23B respectively show an arrangement configuration where the vibrator 70 is upside down from the cases shown in FIGS. 18 to 21 in a similar manner as in FIG. 14A on the right side, and schematically show cross sections, similar to those in FIG. 14B, on the left. Each of FIGS. 22A, 22B, 23A, and 23B shows an arrangement where the vibrator 70 is upside down from the cases shown in FIGS. 18A to 21B.

These arrangement configurations are the same as those shown in FIGS. 17C and 17D, where the two driving contacting parts having a narrow interval are arranged on the top of the vibrator 70, whereas the two driving contacting parts having a wide interval are arranged at the bottom of the vibrator 70. In this form, as also shown in FIGS. 17C and 17D, the 2 lower driving contacting parts having the wide interval always contact the moving lower guide shaft, but either of the two upper driving contacting parts having the narrow interval tends to be apart from the fixed upper guide shaft.

By combining such a configuration characteristic and the driving contacting part having a powerful guide function or a powerful driving function, a move driving characteristic, which is unique to each of the arrangement configurations, for the vibrator 70 is obtained.

FIGS. 18A and 18B show the arrangement configurations giving precedence to the guide function. A form of the contact engagement of the 2 upper driving contacting parts having a narrow interval and the guide shaft, and a form of the contact engagement of the 2 driving contacting parts having a wide interval and the guide shaft are configurations where the driving contacting part 76-4 having the powerful guide function, which are shown in FIG. 16B, 16D or 16E, and the guide shafts 77 (77-1, 77-2) or the modified guide shaft 77-3 are used. These configurations can best suppress the rotational move of the vibrator 70 in the move direction and the perpendicular direction.

Figure 19A:
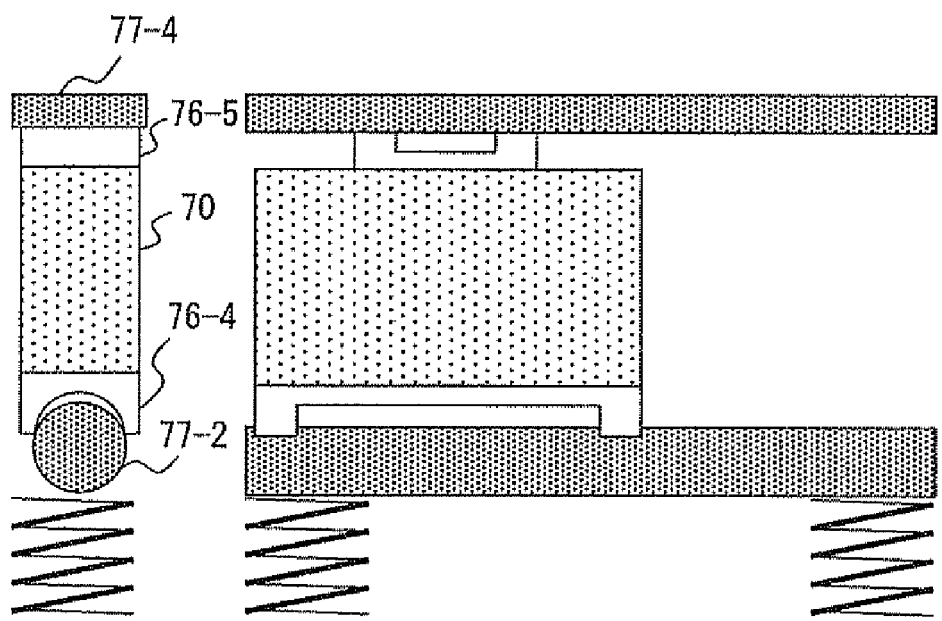
FIGS. 19A and 19B are schematics (No. 2) explaining a contact engagement form of driving contacting parts and guide shafts, and the running characteristic of a vibrator in an arrangement configuration of a vibrator, driving contacting parts, and guide shafts.

FIG. 19A shows a form, which is not shown in FIG. 15, of the contact engagement of a guide shaft 77-4 having a flat-plate shaped, and a flat-board piece driving contacting part 76-5, which is a driving contacting part having a powerful driving function. A form of the contact engagement of the 2 lower driving contacting parts having a wide interval and the guide shaft is the form of the contact engagement using the driving contacting part 76-4 having the powerful guide function shown in FIG. 16B.

Figure 19B:
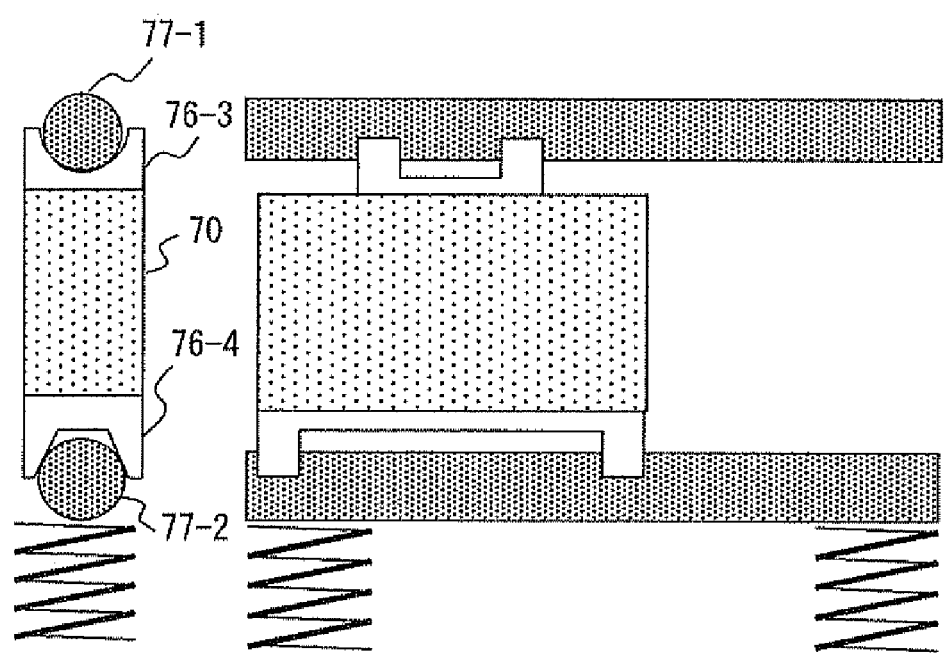

FIG. 19B shows a form of the contact engagement using the driving contacting part 76-3 having the strong driving function shown in FIG. 15B as the form of the contact engagement of the 2 upper driving contacting parts having a narrow interval and the guide shaft, and also shows a form of the contact engagement using the driving contacting part 76-4 having the powerful guide function shown in FIG. 16D as the contact engagement form of the 2 lower driving contacting parts having a wide interval and the guide shafts.

As described above, the driving contacting parts having a powerful driving function are made to contact the fixed upper guide shaft, so that the powerful driving function is maintained even if either of the driving contacting parts is apart from the contact engagement as shown in FIGS. 17C and 17D.

Additionally, as described above, immediately after the driving direction of the vibrator 70 is changed, the gutter of the movable guide shaft 77-2 is pulled. Namely, immediately after the driving direction is changed, the driving force by the driving contacting parts that contact the movable guide shaft 77-2 does not almost occur. Accordingly, the guide shaft and the driving contacting parts are made to contact in the contact form having a powerful driving function for the fixed guide shaft, whereby powerful driving force can be generated immediately after the driving direction is changed.

Furthermore, even if the contact engagement with one guide shaft (the upper guide shaft 77-4 in this figure) is a flat surface contact, the contact engagement with the other guide shaft (the lower guide shaft 77-2 in this figure) is the engagement form having a powerful guide function, whereby the guide function of whole of the vibrator 70 can be secured. Additionally, lower contact is automatically aligned, whereby a horizontal move in the direction perpendicular to the move direction is prevented even if the upper contact is a flat surface contact. As a result, also a rotation in the direction perpendicular to the move direction is prevented. Accordingly, the assembly is easy because there is no need for positioning them in parallel direction. Also the case shown in FIG. 19 conforms to this form.

Both of FIGS. 20A and 20B show arrangement configurations giving precedence to the driving function. A form of the contact engagement of the 2 upper driving contacting parts having a narrow interval and the guide shaft, and a form of the contact engagement of the 2 lower driving contacting parts and the guide shaft are a configuration where the driving contacting part having a powerful driving function 76-3 or 76-5, which is shown in FIG. 15B, 15C, or 19A, and the guide shafts 77 (77-1, 77-2) or the flat-plate shaped guide shaft 77-4. It can be said that the guide function for the vibrator 70 in the move direction is the weakest in this configuration. However, since both of the upper and lower contacting parts have a guide function although it is weak, there is no need for making them parallel (???), and the assembly is easy also in this case.

Figure 21A:
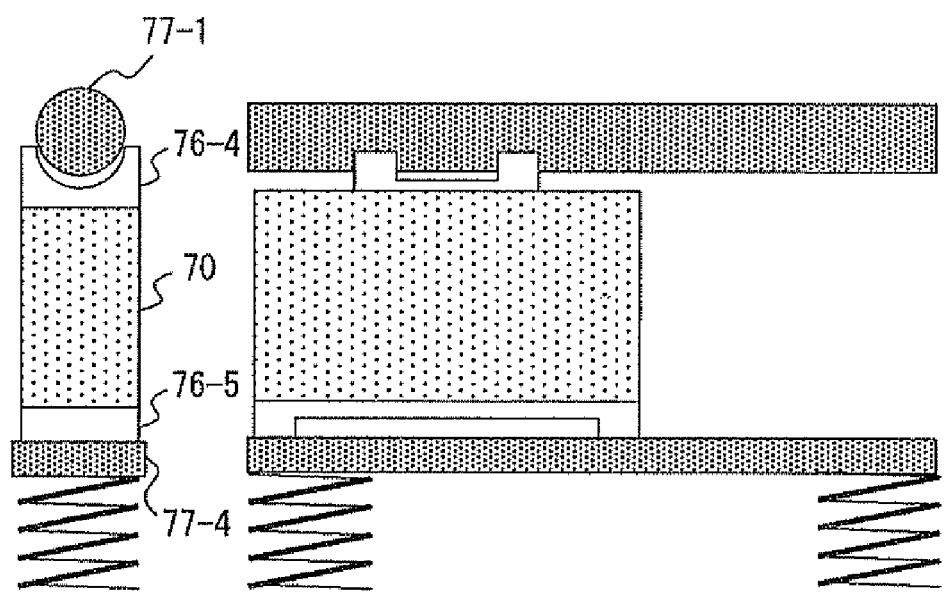
FIGS. 21A and 21B are schematics (No. 4) explaining a contact engagement form of driving contacting parts and guide shafts, and the running characteristic of a vibrator in an arrangement configuration of a vibrator, driving contacting parts, and guide shafts.
Figure 21B:
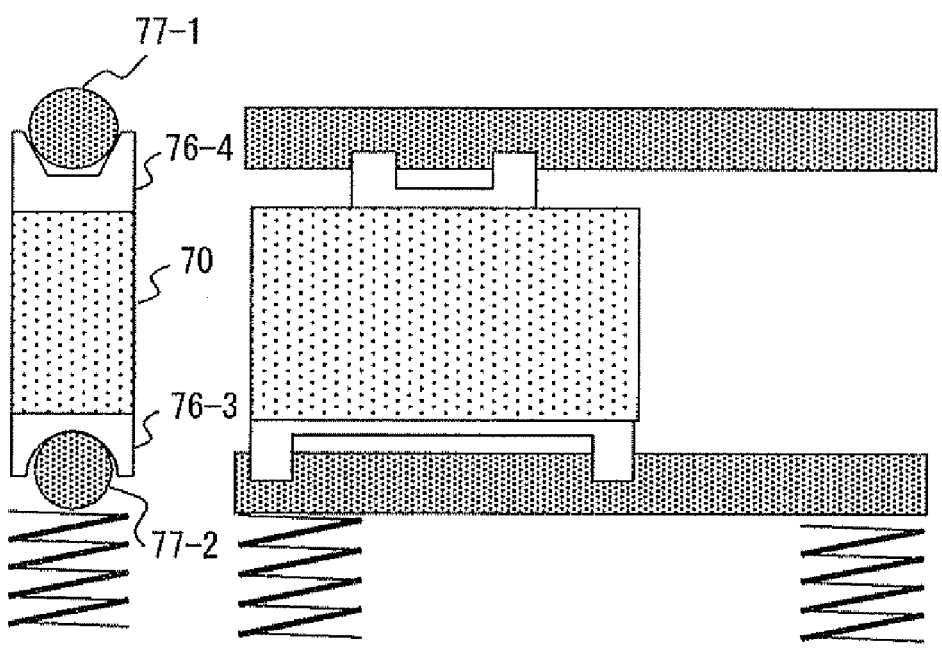

FIGS. 21A and 21B shows a contact engagement form using the driving contacting part 76-4 having the powerful guide function, which is shown in FIG. 16B or 16D, as the contact engagement form of the 2 upper driving contacting parts having a narrow interval and the guide shaft, and also shows a contact engagement form of the upper flat-plate shaped guide shaft 77-4 shown in FIGS. 19A and 20B and the flat-plate piece driving contacting part 76-5, or the contact engagement form of the driving contacting part 76-3 having the powerful driving function, which is shown in FIG. 15B, and the guide shaft 77-2 as the contact engagement form of the 2 lower driving contacting parts having a wide interval and the guide shaft.

This arrangement form is a form where both the guide function and the driving function operate well, and the 2 upper driving contacting parts 76-4 having a narrow interval and a powerful guide function contact the fixed upper guide shaft 77-1, and exert the powerful guide function. In the meantime, the 2 lower driving contacting parts 76-5 or 76-3 having a powerful driving function always contact the moving lower guide shaft as shown in FIGS. 17C and 17D, whereby they can exert the powerful driving function.

Furthermore, in the above described examples shown in FIGS. 18A to 21B, the driving contacting parts 76 arranged on the side of the center (the center of gravity) of the vibrator unit 75 are made to contact the fixed guide shaft 77-1. Namely, the deformation of the vibrator unit 75 exerts almost no influence. Namely, the driving contacting parts that can generate the driving force efficiently contact the fixed guide shaft 77-1 also in the arrangement form of the driving contacting parts. As a result, the driving force can be stably obtained immediately after the driving direction of the vibrator 70 is changed.

As described above, the arrangement of the driving contacting parts, the contact form of the driving contacting parts and the guide shafts, and the fixing/movability of the guide shafts are suitably selected, whereby the driving force can be generated efficiently. Additionally, driving contacting parts having a narrow arrangement interval among driving contacting parts arranged on the vibrator are made to face the fixed guide shaft, and the contact engagement form of the driving contacting parts and the guide shafts is implemented as the above described form having a powerful driving function, whereby the driving force can be generated with great efficiency.

FIGS. 22A, 22B, 23A, and 23B are identical to the arrangement configurations shown in FIGS. 17A and 17B. Namely, 2 driving contacting parts having a wide interval are arranged on the top of the vibrator 70, whereas 2 driving contacting parts having a narrow interval are arranged on the bottom of the vibrator 70. In this form, the 2 upper driving contacting parts having a wide interval always contact the fixed upper guide shaft, but either of the 2 lower driving contacting parts having a narrow interval tends to be apart from the moving lower guide shaft.

Also in this case, the above described configuration characteristics, and the driving contacting parts having a powerful guide function or a powerful driving function are combined, whereby a move driving characteristic for the vibrator 70, which is unique to the respective arrangements, can be obtained.

Firstly, FIGS. 22A and 22B show a contact engagement form using the driving contacting part 76-4 having a powerful guide function, which is shown in FIG. 16B or 16D, as the contact engagement form of the 2 upper driving contacting parts having a wide interval and the guide shafts, and also show a contact engagement form using the flat-plate shaped guide shaft 77-4 and the flat-plate piece driving contacting part 76-5 having a powerful driving function, which is shown in FIGS. 19A and 20B, or a contact engagement form using the driving contacting part 76-3 having a powerful driving function, which is shown in FIG. 15B, and the guide shaft 77-2 as the contact engagement form of the 2 lower driving contacting parts having a narrow interval and the guide shaft.

This arrangement form is a form where both of the guide function and the driving function operate well, and the 2 upper driving contacting parts 76-4 having a wide interval and powerful guide function always contact the fixed upper guide shaft 77-1, and exert the powerful guide function. In the meantime, either of the 2 lower driving contacting parts 76-5 and 76-3 having a narrow interval and a powerful driving function tends to be apart from the moving lower guide shaft, but the other always contacts the lower guide shaft as shown in FIGS. 17A and 17B, so that the powerful driving function can be delivered.

Additionally, the contact engagement form of the driving contacting parts and the guide shafts is implemented as a form having a powerful guide function, and the driving contacting parts 78 having a wide arrangement interval is made to contact the fixed guide shaft 77-1, whereby the vibrator 70 can be guided more accurately. Namely, the arrangement interval of driving contacting parts, a contact form of the driving contacting parts and the guide shafts, and the fixing/movability of the guide shafts are suitably selected, whereby the vibrator 70 can be guided more accurately.

Furthermore, the driving contacting parts having a wide arrangement interval among the driving contacting parts arranged on the vibrator are made to face the fixed guide shaft, and the contact engagement form of the driving contacting parts and the guide shafts is implemented as the above described form having a powerful guide function, whereby the vibrator 70 can be guided more accurately.

FIGS. 23A and 23B show a contact engagement form using the driving contacting parts 76-3 having a powerful driving function, which are shown in FIG. 15C or 15B, as the contact engagement form of the 2 upper driving contacting parts having a wide interval and the guide shaft, and also show a contact engagement form using the driving contacting parts 76-4 having a powerful guide function, which are shown in FIG. 16D, as the contact engagement form of the 2 lower driving contacting parts having a narrow interval and the guide shaft.

As described above, in FIGS. 23A and 23B, the driving contacting parts having a powerful driving function are made to contact the fixed upper guide shaft, whereby the vibrator 70 can be driven with the driving force generated by the driving contacting parts having a powerful driving function immediately after the move direction of the vibrator 70 is reversed.

Additionally, the driving contacting parts having a powerful guide function are made to contact the moving lower guide shaft, whereby the powerful guide function can be maintained even if one of the driving contacting parts is apart from the contact engagement as shown in FIGS. 17A and 17B. As described above, the arrangement configurations shown in FIGS. 23A and 23B are configurations where both the guide function and the driving function can operate well.

As described above up to this point, in the vibration wave linear motor according to this preferred embodiment, driving contacting parts having a groove, the entire shape of which is a convex state and which has a concave groove, in the center on two opposed surfaces of the vibrator unit shaped like, for example, a rectangular parallelepiped, two guide shafts a partial round surface of which penetrates in the concave groove, and which sandwich the vibrator via the driving contacting parts are arranged, one of the two guide shafts is fixed, the other is pressed toward the one guide shaft, and the two guide shafts always sandwich the vibrator while pressing the vibrator. As a result, the driving contacting parts generate elliptical driving vibrations with the vibration wave of the vibrator, the vibrator and the guide shafts make a relative move in the direction of the shafts, and the move direction is controlled with the engagement of the concave groove of the driving contacting parts and the guide shafts so that the vibrator is prevented from deviating from the shaft direction.

Additionally, this preferred embodiment refers to the examples where the plurality of driving contacting parts are formed integrally. However, the present invention is not limited to these implementations. Respectively separate driving contacting parts may be attached to the vibrator unit.

As described above, the vibration wave linear motor according to this preferred embodiment configures an independent vibration wave linear motor as a single body, and the relative move of the vibrator and the guide shafts in the shaft direction of the guide shafts can be easily taken out as the move driving force for an object to be driven to move of an external member or an external apparatus. As a result, the vibration wave linear motor that can be reduced in size with a simple configuration can be provided.

As described above, the vibration wave linear motor according to the present invention has an independent configuration as a single body with a simple structure, where the vibrator and the guide shafts make a relative move in the shaft direction. The relative move of the vibrator and the guide shafts in the shaft direction can be easily taken out as the move driving force for an object to be driven to move of an external member or an external apparatus. As a result, the vibration wave linear motor that can be reduced in size with a simple configuration can be provided.

What is claimed is:

1. A vibration wave linear motor, comprising:
   a base board;
   a first contacting member fixed to the base board;
   a second contacting member arranged to be movable toward the first contacting member;
   a pressing unit pressing the second contacting member toward the first contacting member;
   a vibrator, which is arranged between the first and the second contacting members, vibrating by being applied with a driving signal, and making a relative move in a predetermined relative move direction with reference to the first contacting member;
   first and second driving contacting parts provided at a predetermined interval in the relative move direction to contact the first contacting member on a side of the vibrator, which faces the first contacting member; and
   a third driving contacting part provided in a position corresponding to in between the first and the second driving parts, in order to contact the second contacting member on a side of the vibrator, which faces the second contacting member.

2. The vibration wave linear motor according to claim 1, wherein the third driving contacting part is arranged in a position nearer to a position of the center of gravity of the vibrator than arrangement positions of the first and the second driving contacting parts in the relative move direction.

3. The vibration wave linear motor according to claim 2, further comprising
   a fourth driving contacting part provided to contact the second contacting member on the side of the vibrator, which faces the second contacting member, wherein an arrangement interval between the third and the fourth driving contacting parts is narrower than an arrangement interval between the first and the second driving contacting parts.

4. The vibration wave linear motor according to claim 3, wherein the fourth driving contacting part is provided in a position corresponding to in between the first and the second driving contacting parts in the relative move direction of the vibrator.

5. The vibration wave linear motor according to claim 1, wherein the first and the second driving contacting parts are arranged in neighborhoods of ends of the vibrator in the relative move direction.

6. The vibration wave linear motor according to claim 1, wherein the first driving contacting part provided to contact the first contacting member on a side of the vibrator, which faces the first contacting member;

a first groove provided in the first driving contacting part, and formed in a portion to contact the first contacting member;

the second driving contacting part arranged along with the first driving contacting part at a predetermined interval on a same side in the relative move direction, and provided to contact the first contacting member;

a second groove provided in the second driving contacting part, and formed in a portion to contact the first contacting member;

the third driving contacting part provided to contact the second contacting member on a side of the vibrator, which faces the second contacting member, and arranged in a position corresponding to in between the first and the second driving contacting parts in the relative move direction; and a third groove provided in the third driving contacting part, and formed in a portion to contact the facing second contacting member, wherein the first and the second driving contacting parts are arranged to contact the first contacting member on the side of the vibrator, which faces the first contacting member, and a position of the vibrator in the relative move direction, and a direction orthogonal to an arrangement direction of the first and the second contacting members is controlled with the first groove.

7. The vibration wave linear motor according to claim 6, wherein a play between the third groove and the second contacting member is larger than a play between the first and second grooves and the first contacting member.

8. The vibration wave linear motor according to claim 6, wherein a play between the first groove and the first contacting member, and a play between the second groove and the second contacting member are almost equal.

9. The vibration wave linear motor according to claim 6, wherein the first contacting member contacts at least two points except for a bottom of the first groove.

* * * * *